(12) United States Patent
Chen et al.

(10) Patent No.: US 8,293,328 B2
(45) Date of Patent: Oct. 23, 2012

(54) ENHANCED COPPER GROWTH WITH ULTRATHIN BARRIER LAYER FOR HIGH PERFORMANCE INTERCONNECTS

(75) Inventors: Ling Chen, Sunnyvale, CA (US); Hua Chung, San Jose, CA (US); Barry L. Chin, Saratoga, CA (US); Hong Zhang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1623 days.

(21) Appl. No.: 11/470,915

(22) Filed: Sep. 7, 2006

(65) Prior Publication Data
US 2007/0003698 A1 Jan. 4, 2007

Related U.S. Application Data

(63) Continuation of application No. 10/199,415, filed on Jul. 18, 2002, now abandoned.

(60) Provisional application No. 60/346,086, filed on Oct. 26, 2001.

(51) Int. Cl.
*C23C 16/00* (2006.01)
(52) U.S. Cl. ......... 427/255.28; 427/255.23; 427/255.36; 427/255.391; 427/255.394
(58) Field of Classification Search ............. 427/255.23, 427/255.28, 255.36, 255.391, 255.394
See application file for complete search history.

(56) References Cited

U.S. PATENT DOCUMENTS

| | | | |
|---|---|---|---|
| 4,389,973 A | 6/1983 | Suntola et al. |
| 4,413,022 A | 11/1983 | Suntola et al. |
| 4,486,487 A | 12/1984 | Skarp |
| 4,825,809 A | 5/1989 | Mieno et al. |
| 5,000,113 A | 3/1991 | Wang et al. |
| 5,221,449 A | 6/1993 | Colgan et al. |
| 5,281,485 A | 1/1994 | Colgan et al. |
| 5,306,666 A | 4/1994 | Izumi |
| 5,374,570 A | 12/1994 | Nasu et al. |
| 5,526,244 A | 6/1996 | Bishop |
| 5,711,811 A | 1/1998 | Suntola et al. |
| 5,916,365 A | 6/1999 | Sherman |
| 5,923,056 A | 7/1999 | Lee et al. |
| 5,935,490 A | 8/1999 | Archbold et al. |
| 5,951,771 A | 9/1999 | Raney et al. |
| 6,015,590 A | 1/2000 | Suntola et al. |

(Continued)

FOREIGN PATENT DOCUMENTS

CN     1244037     2/2000

(Continued)

OTHER PUBLICATIONS

Notice of Reasons for Rejection dated Mar. 3, 2009 for Japanese Application No. 2003/538423.

(Continued)

*Primary Examiner* — Brian K Talbot
(74) *Attorney, Agent, or Firm* — Patterson & Sheridan, LLP

(57) ABSTRACT

A method for depositing a refractory metal nitride barrier layer having a thickness of about 20 angstroms or less is provided. In one aspect, the refractory metal nitride layer is formed by introducing a pulse of a metal-containing compound followed by a pulse of a nitrogen-containing compound. The refractory metal nitride barrier layer provides adequate barrier properties and allows the grain growth of the first metal layer to continue across the barrier layer into the second metal layer thereby enhancing the electrical performance of the interconnect.

20 Claims, 8 Drawing Sheets

U.S. PATENT DOCUMENTS

| | | | |
|---|---|---|---|
| 6,015,917 A | 1/2000 | Bhandari et al. | |
| 6,066,358 A | 5/2000 | Guo et al. | |
| 6,084,302 A | 7/2000 | Sandhu | |
| 6,124,158 A | 9/2000 | Dautartas et al. | |
| 6,139,700 A | 10/2000 | Kang et al. | |
| 6,140,234 A | 10/2000 | Uzoh et al. | |
| 6,143,077 A * | 11/2000 | Ikeda et al. | 118/715 |
| 6,144,060 A | 11/2000 | Park et al. | |
| 6,153,519 A | 11/2000 | Jain et al. | |
| 6,174,809 B1 | 1/2001 | Kang et al. | |
| 6,184,138 B1 | 2/2001 | Ho et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,207,302 B1 | 3/2001 | Sugiura et al. | |
| 6,207,487 B1 | 3/2001 | Kim et al. | |
| 6,218,302 B1 | 4/2001 | Braeckelmann et al. | |
| 6,270,572 B1 | 8/2001 | Kim et al. | |
| 6,271,148 B1 | 8/2001 | Kao et al. | |
| 6,274,008 B1 | 8/2001 | Gopalraja et al. | |
| 6,284,646 B1 | 9/2001 | Leem | |
| 6,287,965 B1 | 9/2001 | Kang et al. | |
| 6,305,314 B1 | 10/2001 | Sneh et al. | |
| 6,306,216 B1 | 10/2001 | Kim et al. | |
| 6,342,277 B1 | 1/2002 | Sherman | |
| 6,348,376 B2 | 2/2002 | Lim et al. | |
| 6,358,829 B2 | 3/2002 | Yoon et al. | |
| 6,368,954 B1 * | 4/2002 | Lopatin et al. | 438/627 |
| 6,372,598 B2 | 4/2002 | Kang et al. | |
| 6,379,748 B1 | 4/2002 | Bhandari et al. | |
| 6,383,330 B1 * | 5/2002 | Raaijmakers | 156/345.1 |
| 6,391,785 B1 | 5/2002 | Satta et al. | |
| 6,399,491 B2 | 6/2002 | Jeon et al. | |
| 6,416,577 B1 | 7/2002 | Suntoloa et al. | |
| 6,416,822 B1 | 7/2002 | Chiang et al. | |
| 6,428,847 B1 * | 8/2002 | Grant et al. | 427/248.1 |
| 6,428,859 B1 | 8/2002 | Chiang et al. | |
| 6,436,817 B2 | 8/2002 | Lee | |
| 6,451,119 B2 | 9/2002 | Sneh et al. | |
| 6,451,695 B2 | 9/2002 | Sneh et al. | |
| 6,458,701 B1 | 10/2002 | Chae et al. | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,482,262 B1 | 11/2002 | Elers et al. | |
| 6,482,733 B2 | 11/2002 | Raaijmakers et al. | |
| 6,511,539 B1 | 1/2003 | Raaijmakers | |
| 6,534,395 B2 | 3/2003 | Werkhoven et al. | |
| 6,548,424 B2 | 4/2003 | Putkonen | |
| 6,551,929 B1 | 4/2003 | Kori et al. | |
| 6,562,140 B1 | 5/2003 | Bondestam et al. | |
| 6,569,501 B2 | 5/2003 | Chiang et al. | |
| 6,580,111 B2 | 6/2003 | Kim et al. | |
| 6,585,823 B1 | 7/2003 | Van Wijck | |
| 6,596,602 B2 | 7/2003 | Iizuka et al. | |
| 6,599,572 B2 | 7/2003 | Saanila et al. | |
| 6,607,976 B2 | 8/2003 | Chen et al. | |
| 6,610,151 B1 | 8/2003 | Cohen | |
| 6,616,986 B2 | 9/2003 | Sherman | |
| 6,620,723 B1 | 9/2003 | Byun et al. | |
| 6,630,201 B2 | 10/2003 | Chiang et al. | |
| 6,632,279 B1 | 10/2003 | Ritala et al. | |
| 6,664,192 B2 | 12/2003 | Satta et al. | |
| 6,686,271 B2 | 2/2004 | Raaijmakers et al. | |
| 6,706,115 B2 | 3/2004 | Leskela et al. | |
| 6,734,020 B2 | 5/2004 | Lu et al. | |
| 6,797,108 B2 | 9/2004 | Wendling | |
| 6,818,250 B2 | 11/2004 | George et al. | |
| 6,821,563 B2 | 11/2004 | Yudovsky | |
| 6,866,746 B2 | 3/2005 | Lei et al. | |
| 6,916,398 B2 | 7/2005 | Chen et al. | |
| 6,951,804 B2 | 10/2005 | Seutter et al. | |
| 7,066,194 B2 | 6/2006 | Ku et al. | |
| 7,094,680 B2 | 8/2006 | Seutter et al. | |
| 7,175,713 B2 | 2/2007 | Thakur et al. | |
| 7,204,886 B2 | 4/2007 | Chen et al. | |
| 7,228,873 B2 | 6/2007 | Ku et al. | |
| 7,402,210 B2 | 7/2008 | Chen et al. | |
| 7,408,225 B2 | 8/2008 | Shinriki et al. | |
| 2001/0000866 A1 | 5/2001 | Sneh et al. | |
| 2001/0002280 A1 | 5/2001 | Sneh | |
| 2001/0009140 A1 | 7/2001 | Bondestam et al. | |
| 2001/0009695 A1 | 7/2001 | Saanila et al. | |
| 2001/0024387 A1 | 9/2001 | Raaijmakers et al. | |
| 2001/0025979 A1 | 10/2001 | Kim et al. | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0050039 A1 | 12/2001 | Park | |
| 2001/0054730 A1 | 12/2001 | Kim et al. | |
| 2001/0054769 A1 | 12/2001 | Raaijmakers et al. | |
| 2002/0000598 A1 | 1/2002 | Kang et al. | |
| 2002/0007790 A1 | 1/2002 | Park | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0041931 A1 | 4/2002 | Suntola et al. | |
| 2002/0048635 A1 | 4/2002 | Kim et al. | |
| 2002/0052097 A1 | 5/2002 | Park | |
| 2002/0060363 A1 | 5/2002 | Xi et al. | |
| 2002/0068458 A1 | 6/2002 | Chiang et al. | |
| 2002/0073924 A1 | 6/2002 | Chiang et al. | |
| 2002/0074588 A1 | 6/2002 | Lee | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0076837 A1 | 6/2002 | Hujanen et al. | |
| 2002/0081844 A1 | 6/2002 | Jeon et al. | |
| 2002/0086111 A1 | 7/2002 | Byun et al. | |
| 2002/0086507 A1 | 7/2002 | Park et al. | |
| 2002/0094689 A1 | 7/2002 | Park | |
| 2002/0098627 A1 | 7/2002 | Pomarede et al. | |
| 2002/0104481 A1 | 8/2002 | Chiang et al. | |
| 2002/0106536 A1 | 8/2002 | Lee et al. | |
| 2002/0106846 A1 | 8/2002 | Seutter et al. | |
| 2002/0117399 A1 | 8/2002 | Chen et al. | |
| 2002/0127336 A1 | 9/2002 | Chen et al. | |
| 2002/0135071 A1 | 9/2002 | Kang et al. | |
| 2002/0144655 A1 | 10/2002 | Chiang et al. | |
| 2002/0144657 A1 | 10/2002 | Chiang et al. | |
| 2002/0146511 A1 | 10/2002 | Chiang et al. | |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0187631 A1 | 12/2002 | Kim et al. | |
| 2002/0197402 A1 | 12/2002 | Chiang et al. | |
| 2002/0197863 A1 | 12/2002 | Mak et al. | |
| 2003/0013300 A1 | 1/2003 | Byun | |
| 2003/0013320 A1 | 1/2003 | Kim et al. | |
| 2003/0031807 A1 | 2/2003 | Elers et al. | |
| 2003/0032281 A1 | 2/2003 | Werkhoven et al. | |
| 2003/0042630 A1 | 3/2003 | Babcoke et al. | |
| 2003/0049931 A1 | 3/2003 | Byun et al. | |
| 2003/0049942 A1 | 3/2003 | Haukka et al. | |
| 2003/0053799 A1 | 3/2003 | Lei | |
| 2003/0054631 A1 | 3/2003 | Raaijmakers et al. | |
| 2003/0057526 A1 | 3/2003 | Chung et al. | |
| 2003/0057527 A1 | 3/2003 | Chung et al. | |
| 2003/0059538 A1 | 3/2003 | Chung et al. | |
| 2003/0072884 A1 | 4/2003 | Zhang et al. | |
| 2003/0072975 A1 | 4/2003 | Shero et al. | |
| 2003/0079686 A1 | 5/2003 | Chen et al. | |
| 2003/0082296 A1 | 5/2003 | Elers et al. | |
| 2003/0082300 A1 | 5/2003 | Todd et al. | |
| 2003/0082301 A1 | 5/2003 | Chen et al. | |
| 2003/0082307 A1 | 5/2003 | Chung et al. | |
| 2003/0089308 A1 | 5/2003 | Raaijamakers et al. | |
| 2003/0101927 A1 | 6/2003 | Raaijmakers et al. | |
| 2003/0106490 A1 | 6/2003 | Jallepally et al. | |
| 2003/0108674 A1 | 6/2003 | Chung et al. | |
| 2003/0113187 A1 | 6/2003 | Lei et al. | |
| 2003/0116087 A1 | 6/2003 | Nguyen et al. | |

| | | |
|---|---|---|
| 2003/0121608 A1 | 7/2003 | Chen et al. |
| 2003/0124262 A1 | 7/2003 | Chen et al. |
| 2003/0129826 A1 | 7/2003 | Werkhoven et al. |
| 2003/0134038 A1* | 7/2003 | Paranjpe .................... 427/248.1 |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0205729 A1 | 11/2003 | Basceri et al. |
| 2003/0213987 A1 | 11/2003 | Basceri et al. |
| 2003/0224578 A1 | 12/2003 | Chung et al. |
| 2003/0224600 A1 | 12/2003 | Cao et al. |
| 2004/0009307 A1 | 1/2004 | Koh et al. |
| 2004/0011504 A1 | 1/2004 | Ku et al. |
| 2004/0013803 A1 | 1/2004 | Chung et al. |
| 2004/0014320 A1 | 1/2004 | Chen et al. |
| 2004/0015300 A1 | 1/2004 | Ganguli et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0033698 A1 | 2/2004 | Lee et al. |
| 2004/0043630 A1 | 3/2004 | Vaartstra et al. |
| 2004/0046197 A1 | 3/2004 | Basceri et al. |
| 2005/0139160 A1 | 6/2005 | Lei et al. |
| 2005/0173068 A1 | 8/2005 | Chen et al. |
| 2005/0252449 A1 | 11/2005 | Nguyen et al. |
| 2005/0271812 A1 | 12/2005 | Myo et al. |
| 2005/0271813 A1 | 12/2005 | Kher et al. |
| 2006/0030148 A1 | 2/2006 | Seutter et al. |
| 2006/0216928 A1 | 9/2006 | Chung et al. |
| 2007/0059948 A1 | 3/2007 | Metzner et al. |
| 2007/0095285 A1 | 5/2007 | Thakur et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2008/0038463 A1 | 2/2008 | Chen et al. |
| 2008/0041307 A1 | 2/2008 | Nguyen et al. |
| 2008/0041313 A1 | 2/2008 | Chen et al. |
| 2008/0044569 A1 | 2/2008 | Myo et al. |
| 2008/0102203 A1 | 5/2008 | Wu et al. |
| 2008/0102208 A1 | 5/2008 | Wu et al. |
| 2008/0107809 A1 | 5/2008 | Wu et al. |
| 2008/0268171 A1 | 10/2008 | Ma et al. |
| 2008/0268636 A1* | 10/2008 | Yoon et al. .................... 438/655 |
| 2008/0274299 A1 | 11/2008 | Chen et al. |

FOREIGN PATENT DOCUMENTS

| | | |
|---|---|---|
| EP | 1 077 484 | 2/2001 |
| EP | 1 167 569 | 1/2002 |
| GB | 2 355 727 | 5/2001 |
| JP | 02-246161 | 9/1990 |
| JP | 4087323 | 3/1992 |
| JP | 07-300649 | 11/1995 |
| JP | 2000-31387 | 1/2000 |
| JP | 2000-58777 | 2/2000 |
| JP | 2001020075 | 1/2001 |
| JP | 10-308283 | 3/2001 |
| JP | 2001-172767 | 6/2001 |
| JP | 2001-220294 | 8/2001 |
| JP | 2001-254181 | 9/2001 |
| JP | 2001-111000 | 12/2002 |
| WO | WO 96/17107 | 6/1996 |
| WO | WO 99/01595 | 1/1999 |
| WO | WO-9919260 | 4/1999 |
| WO | WO 99/29924 | 6/1999 |
| WO | WO 99/65064 | 12/1999 |
| WO | WO 00/15865 | 3/2000 |
| WO | WO 00/16377 | 3/2000 |
| WO | WO 00/54320 | 9/2000 |
| WO | WO 00/63957 | 10/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29893 | 4/2001 |
| WO | WO 01/36702 | 5/2001 |
| WO | WO 01/29891 | 6/2001 |
| WO | WO 01/66832 | 9/2001 |
| WO | WO 02/01628 | 1/2002 |
| WO | WO 02/08485 | 1/2002 |
| WO | WO 02/43115 | 5/2002 |
| WO | WO 02/45167 | 6/2002 |
| WO | WO 02/45871 | 6/2002 |
| WO | WO 02/067319 | 8/2002 |

OTHER PUBLICATIONS

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

George, et al. "Surface Chemistry for Atomic Layer Growth," J. Phys. Chem. 1996, 100, pp. 13121-13131.

Hultunen, et al. "Nitrides of titanium, niobium, tantalum and molybdenum grown as thin films by the atomic layer epitaxy method," Thin Solid Films, 166 (1988), pp. 149-154.

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

International Search Report from the European Patent Office for International Application No. PCT/US 02/34553, dated May 8, 2003.

International Search Report from the European Patent Office for International Application No. PCT/US 02/34277, dated May 9, 2003.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) pp. 435-448.

Kukli, et al. "Atomic Layer Epitaxy Growth of Tantalum Oxide Thin Films from $Ta(OC_2H_5)_5$ and $H_2O$," J. Electrochem. Soc., vol. 142, No. 5, May 1995, pp. 1670-1675.

Kukli, et al. "In-situ Study of Atomic Layer Epitaxy Growth of Tantalum Oxide Thin Films from $Ta(OC_2H_5)_5$ and $H_2O$," Applied Surface Science, Mar. 1997, pp. 236-242.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," NanoStructured Materials, vol. 8, No. 7, 1997, pp. 785-793.

Kukli, et al. "Properties of $Ta_2O_5$-based Dielectric Nanolaminates Deposited by Atomic Layer Epitaxy," J. Electrochem. Soc., vol. 144, No. 1 Jan. 1997, pp. 300-306.

Kukli, et al. "Tailoring the Dielectric Properties of $HfO_2$-$Ta_2O_5$ Nanolaminates," Appl. Phys. Lett. 68 (26), Jun. 24, 1996, pp. 3737-3739.

Leskela, et al. "Atomic layer epitaxy in deposition of various oxide and nitride thin films," Colloque C5, supplement au Journal de Physique II, vol. 5, Jun. 1995, pp. 937-951.

Martensson, et al. "Use of Atomic Layer Epitaxy for Fabrication of Si/TiN/Cu Structures," J. Vac. Sol. & Tech. B, vol. 17, No. 5, (Sep. 1999), pp. 2122-2128.

Min, et al. "Atomic Layer Deposition of TiN Thin Films by Sequential Introduction of Ti Precursor and NH3," Mat Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) pp. 23-29.

Partial Search Report (Annex to Form PCT/ISA/206), dated Oct. 25, 2002 for PCT/US02/02651.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug. 1998), pp. 2914-2920.

Ritala, et al. "Atomic Layer Epitaxy Growth of TiN Thin Films," J. Electrochem. Soc., vol. 142, No. 8, Aug. 1995.

Ritala, et al. "Controlled growth of TaN, $Ta_3N_5$, and $TaO_xN_y$ thin films by atomic layer deposition," Chem. Mater., vol. 11, No. 7, 1999, pp. 1712-1718.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993), pp. 288-295.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Ritala, et al. "Perfectly Conformal TiN and $Al_2O_3$ Films Deposited by Atomic Layer Deposition," Chemical Vapor Deposition, Jan. 1999, vol. 5, No. 1, pp. 6-9.

Rossnagel., et al. "Plasma-enhanced atomic layer deposition of Ta and Ti for interconnect diffusion barriers," J. Vac. Sci. Technol. B 18(4), Jul./Aug. 2000.

Bedair, Atomic Layer Epitaxy Deposition Processes, J. Vac. Sci. Technol. B 12(1) Jan.Feb. 1994 p. 179-185.

Juppo et al., Use of 1 1-Dimethylhydrazine in the Atomic Layer Deposition of Transition Metal Nitride Thin Films, Journal of Electrochemical Society 147 (9) 2000 p. 3377-3381.

Shacham-Diamand, Barrier Layers for Cu ULSI Metallization, Journal of Electronic Materials vol. 30 No. 4 2001 p. 336-344.

Written opinion of PCT/US02/02651 dated May 23, 2012.

* cited by examiner

ENHANCED COPPER GROWTH WITH ULTRATHIN BARRIER LAYER FOR HIGH PERFORMANCE INTERCONNECTS

CROSS-REFERENCE TO RELATED APPLICATIONS

This application is a continuation of U.S. patent application Ser. No. 10/199,415 filed Jul. 18, 2002, now abandoned, which is incorporated by reference herein, and which application claims benefit of U.S. Provisional Patent Application Ser. No. 60/346,086, filed Oct. 26, 2001, which is incorporated by reference herein.

BACKGROUND OF THE INVENTION

1. Field of the Invention

Embodiments of the present invention relate to a method for manufacturing integrated circuit devices. More particularly, embodiments of the invention relate to forming thin barrier layers using cyclic or atomic layer deposition.

2. Description of the Related Art

Copper has recently become a choice metal for filling sub-micron high aspect ratio, interconnect features because copper and its alloys have lower resistivities than aluminum. However, copper and its alloys have a propensity to diffuse into surrounding materials such as silicon oxide, silicon, and other dielectric materials for example, causing an increase in the contact resistance of the circuit. Copper and its alloys also have a propensity to diffuse into surrounding elements such as transistor gates, capacitor dielectrics, transistor wells, transistor channels, electrical barrier regions, interconnects, among other known elements of integrated circuits.

Barrier layers are, therefore, deposited prior to copper metallization to prevent or impede the diffusion of copper atoms. Barrier layers typically consist of a refractory metal such as tungsten, titanium, tantalum, and nitrides thereof, which all have a greater resistivity than copper. Of this group, tantalum nitride is one of the most desirable elements for use as a barrier layer because it has one of the lowest resistivities of refractory metal nitrides and makes a good adhesion layer for copper metallization.

To deposit a barrier layer within a feature, the barrier layer must be deposited on the bottom of the feature as well as the sidewalls thereof. Therefore, the additional amount of the barrier layer on the bottom of the feature not only increases the overall resistance of the feature, but also forms an obstruction between higher and lower metal interconnects of a multi-layered interconnect structure.

It is especially difficult to deposit a suitable barrier layer in features having aspect ratios greater than about 3:1 using conventional deposition techniques. Usually, the barrier layer bridges the opening of the narrow features resulting in the formation of one or more voids or discontinuities within the feature. Since voids increase the resistance and reduce the electromigration resistance of the feature, features having voids make poor and unreliable electrical contacts.

There is a need, therefore, for an improved method for depositing a thin, conformal barrier layer in low aspect ratio features.

SUMMARY OF THE INVENTION

A method for depositing a conformal refractory metal nitride layer having a thickness of about 20 angstroms or less is provided. The refractory metal nitride layer is formed by introducing a pulse of a metal-containing compound followed by a pulse of a nitrogen-containing compound. The refractory metal nitride layer may further be formed by introducing a pulse of a silicon-containing compound. The refractory metal nitride layer provides excellent barrier properties and permits the continuous, uninterrupted growth of a higher level conductive metal layer on a lower level conductive metal layer. In one aspect, the conductive metal layers each contain copper or copper alloys, and the refractory metal nitride layer contains tantalum nitride. In another aspect, the refractory metal layer contains titanium silicon nitride.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
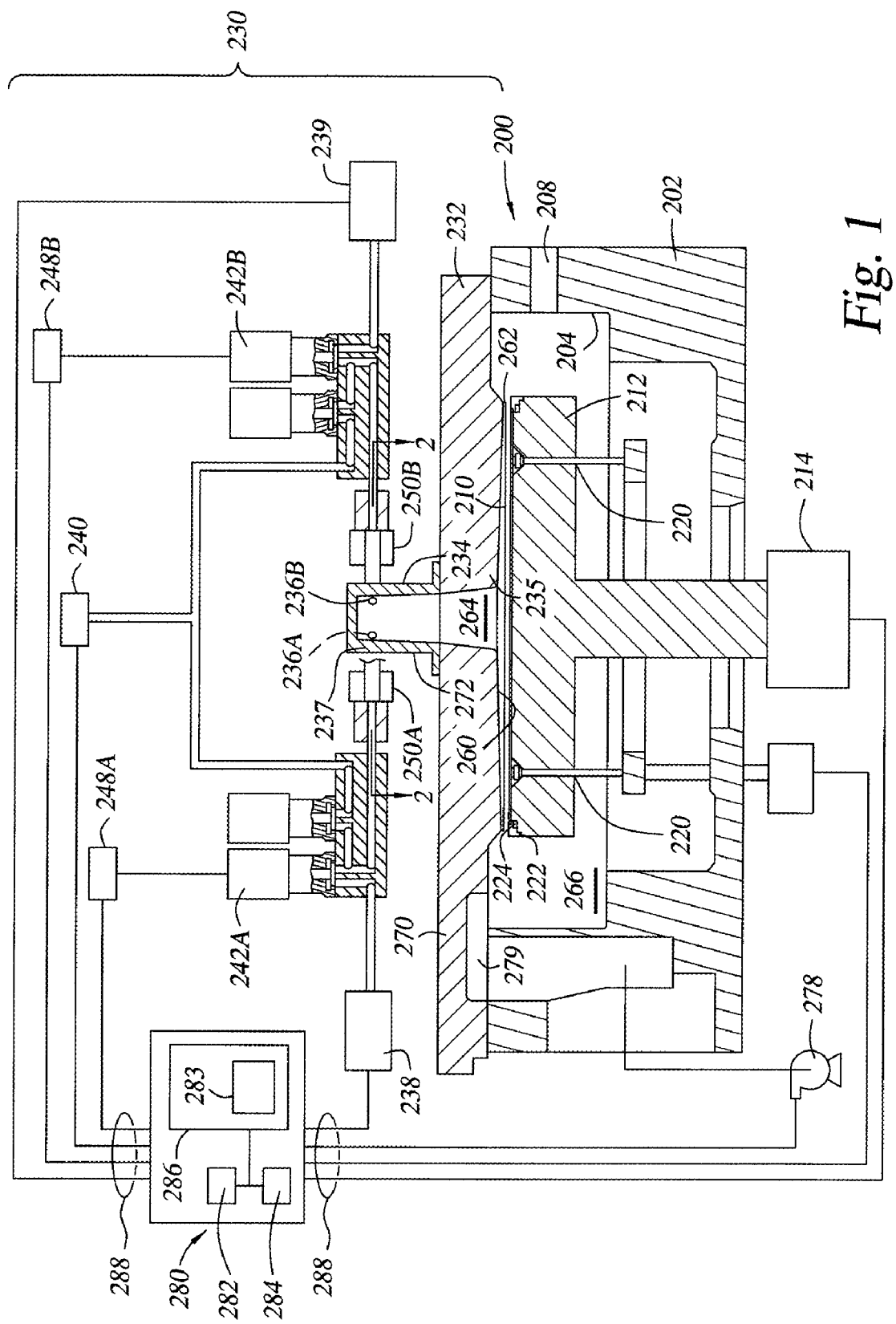
FIG. 1 illustrates a schematic, partial cross section of an exemplary processing chamber 200 for use in a method of forming a barrier layer according to each of the embodiments of the present invention.

Embodiments of the present invention generally provide a method of forming a barrier layer through which conductive metal can be grown. In one embodiment, a cyclical deposition process is used to form a refractory metal nitride layer having a thickness less than about 20 angstroms. In one aspect of this embodiment, the refractory metal nitride layer is a tantalum nitride (TaN) layer that is preferably about 10 angstroms thick. In another aspect of this embodiment, the refractory metal nitride layer is a ternary material, such as titanium silicon nitride, for example.

The barrier layers deposited according to the cyclical deposition techniques described herein provide excellent barrier properties and permit the continuous growth of conductive metal layers thereon. The barrier layers are particularly useful between higher and lower level conductive metal interconnects. The barrier layers significantly enhance the metal interconnect electrical performance by lowering the overall electrical resistance of the feature and also providing good device reliability.

The barrier layers deposited according to the cyclical deposition methods described herein show evidence of an epitaxial growth phenomenon. In other words, the barrier layers take on the same or substantially the same crystallographic characteristics as the underlying layer. As a result, a substantially single crystal is grown such that there is no void formation at an interface between the barrier layer and the underlying layer. Likewise, subsequent metal layers deposited over the barrier layers exhibit the same or substantially the same epitaxial growth characteristics that continue the formation of the single crystal. Accordingly, no void formation is produced at this interface. The resulting structure resembling a single crystal eliminates voids formation, thereby substantially increasing device reliability. The single crystal structure also reduces the overall resistance of the interconnect feature while still providing excellent barrier properties. Furthermore, it is believed that the single crystalline growth reduces the susceptibility of electromigration and stress migration due to the conformal and uniform crystalline orientation across the interconnect material interfaces.

A TaN barrier layer having a thickness of about 20 angstroms or less, about 10 angstroms in at least one embodiment, is deposited by providing one or more pulses of a tantalum-containing compound at a flow rate between about 100 sccm and about 1,000 sccm for a time period of about 1.0 second or less and one or more pulses of a nitrogen-containing compound at a flow rate between about 100 sccm and about 1,000 sccm for a time period of about 1.0 second or less to a reaction zone having a substrate disposed therein. Exemplary tantalum-containing compounds include pentaethyl methylamino-tantalum (PEMAT), pentadiethylamino-tantalum (PDEAT), pentadimethylamino-tantalum (PDMAT) and any derivatives of PEMAT, PDEAT, and PDMAT. Exemplary tantalum-containing compounds also include t-butylimino tris(diethylamino)tantalum (TBTDET), t-butylimino tris (dimethylamino)tantalum (TBTDMT), bis(cyclopentadienyl)tantalum trihydride, bis(methylcyclopentadienyl)tantalum trihydride, and tantalum halides, $TaX_5$, where X is fluorine (F), bromine (Br) or chlorine (Cl), and/or derivatives thereof. Exemplary nitrogen-containing compounds include nitrogen gas, ammonia, hydrazine, methylhydrazine, dimethlyhydrazine, t-butylhydrazine, phenylhydrazine, azotertbutane, ethylazide, and derivatives thereof.

It is to be understood that these compounds or any other compound not listed above may be a solid, liquid, or gas at room temperature. For example, PDMAT is a solid at room temperature and TBTDET is a liquid at room temperature. Accordingly, the non-gas phase precursors are subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber, as is commonly known in the art.

Each pulse is performed sequentially, and is accompanied by a separate flow of non-reactive gas at a rate between about 200 sccm and about 1,000 sccm. The separate flow of non-reactive gas may be pulsed between each pulse of the reactive compounds or the separate flow of non-reactive gas may be introduced continuously throughout the deposition process.

The separate flow of non-reactive gas, whether pulsed or continuous, serves to remove any excess reactants from the reaction zone to prevent unwanted gas phase reactions of the reactive compounds, and also serves to remove any reaction by-products from the processing chamber, similar to a purge gas. In addition to these services, the continuous separate flow of non-reactive gas helps deliver the pulses of reactive compounds to the substrate surface similar to a carrier gas. The term "non-reactive gas" as used herein refers to a single gas or a mixture of gases that does not participate in the metal layer formation. Exemplary non-reactive gases include argon, helium, nitrogen, hydrogen, and combinations thereof.

In another embodiment, a ternary barrier layer having a thickness less than about 20 angstroms, preferably about 10 angstroms in at least one embodiment, is deposited by providing one or more pulses of a refractory metal-containing compound at a flow rate between about 10 sccm and about 1,000 sccm, one or more pulses of a nitrogen-containing compound at a flow rate between about 100 sccm and about 5,000 sccm, and one or more pulses of a silicon-containing compound at a flow rate between about 5 sccm and about 500 sccm. Each pulse lasts about 1.0 second or less, and can be adjusted to provide a desirable composition, silicon incorporation level, thickness, density, and step coverage of the refractory metal silicon nitride layer. A "ternary barrier layer" as used herein refers to a material having a composition that includes three major elements, such as titanium, nitrogen and silicon, for example.

Exemplary titanium-containing compounds include tetrakis(dimethylamino)titanium (TDMAT), tetrakis(ethylmethylamino)titanium (TEMAT), tetrakis(diethylamino)titanium (TDEAT), titanium tetrachloride ($TiCl_4$), titanium iodide ($TiI_4$), titanium bromide ($TiBr_4$), and other titanium halides. Exemplary silicon-containing compounds include silane, disilane, methylsilane, dimethylsilane, chlorosilane, dichlorosilane, and trichlorosilane. Exemplary nitrogen-containing compounds include nitrogen gas, ammonia, hydrazine, methylhydrazine, dimethlyhydrazine, t-butylhydrazine, phenylhydrazine, azoisobutane, ethylazide, and derivatives thereof.

As mentioned above, these compounds or any other compound not listed above may be a solid, liquid, or gas at room temperature. The non-gas phase precursors must be subjected to a sublimation or vaporization step, which are both well known in the art, prior to introduction into the processing chamber. A carrier gas, such as argon, helium, nitrogen, hydrogen, or a mixture thereof, may also be used to help deliver the compound into the processing chamber, as is commonly known in the art.

Similar to the process described above, each pulse of compound is performed sequentially, and is accompanied by a separate flow of non-reactive gas. The separate flow of non-reactive gas may be pulsed between each pulse of reactive compound or the separate flow of non-reactive gas may be introduced continuously throughout the deposition process. Exemplary non-reactive gases include argon, helium, nitrogen, hydrogen, and combinations thereof.

A "compound" is intended to include one or more precursors, reductants, reactants, and catalysts. Each compound may be a single compound or a mixture/combination of two or more compounds.

A "thin layer" as used herein refers to a layer of material deposited on a substrate surface having a thickness of about 20 angstroms or less, such as about 10 angstroms. A "feature" as used herein refers to a via, contact, line, or any other interconnect facet, e.g., vertical or horizontal interconnect, having an aspect ratio (height to width ratio) of about 4:1 or greater. A "substrate surface", as used herein, refers to any substrate surface upon which film processing is performed. For example, a substrate surface may include silicon, silicon oxide, doped silicon, germanium, gallium arsenide, glass, sapphire, and any other materials such as metals, metal alloys, and other conductive materials, depending on the application. A substrate surface may also include dielectric materials such as silicon dioxide and carbon doped silicon oxides.

"Cyclical deposition" as used herein refers to the sequential introduction of two or more compounds to deposit a thin layer on a substrate surface. The two or more compounds are sequentially introduced into a reaction zone of a processing chamber. Each compound is separated by a time delay/pause to allow each compound to adhere and/or react on the substrate surface. In one aspect, a first compound or compound A is dosed/pulsed into the reaction zone followed by a first time delay/pause. Next, a second compound or compound B is dosed/pulsed into the reaction zone followed by a second time delay. When a ternary material is desired, such as titanium silicon nitride, for example, a third compound (C), is dosed/pulsed into the reaction zone followed by a third time delay. These sequential tandems of a pulse of reactive compound followed by a time delay may be repeated indefinitely until a desired film or film thickness is formed on the substrate surface.

A "pulse/dose" as used herein is intended to refer to a quantity of a particular compound that is intermittently or non-continuously introduced into a reaction zone of a processing chamber. The quantity of a particular compound within each pulse may vary over time, depending on the duration of the pulse. A particular compound may include a single compound or a mixture/combination of two or more compounds.

A "reaction zone" is intended to include any volume that is in fluid communication with a substrate surface being processed. The reaction zone may include any volume within a processing chamber that is between a gas source and the substrate surface. For example, the reaction zone includes any volume downstream of a dosing valve in which a substrate is disposed.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound, the temperature of the compound, the type of dosing valve, the type of control system employed, as well as the ability of the compound to adsorb onto the substrate surface. Dose times may also vary based upon the type of layer being formed and the geometry of the device being formed.

Typically, the duration for each pulse/dose or "dose time" is typically about 1.0 second or less. However, a dose time can range from microseconds to milliseconds to seconds, and even to minutes. In general, a dose time should be long enough to provide a volume of compound sufficient to adsorb/chemisorb onto substantially the entire surface of the substrate and form a layer of the compound thereon.

FIG. 1 illustrates a schematic, partial cross section of an exemplary processing chamber 200 for use in a method of forming a barrier layer according to each of the embodiments of the present invention. Such a processing chamber 200 is available from Applied Materials, Inc. located in Santa Clara, Calif., and a brief description thereof follows. A more detailed description may be found in commonly assigned U.S. patent application Ser. No. 10/032,284, entitled "Gas Delivery Apparatus and Method For Atomic Layer Deposition", filed on Dec. 21, 2001, which is incorporated herein by reference.

Figure 5:
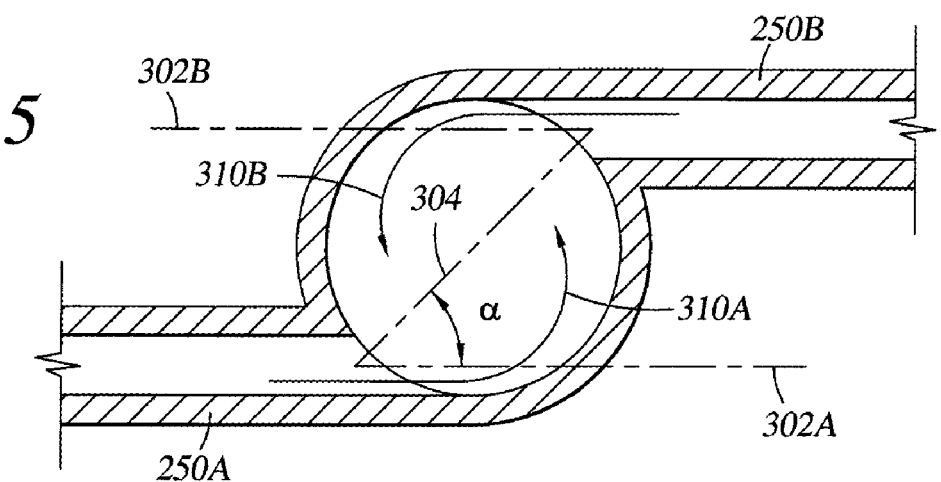
FIG. 5 is a top cross-sectional view of one embodiment of the expanding channel of the chamber lid of FIG. 1.

FIG. 5 is a top cross-sectional view of one embodiment of the expanding section 234 of the chamber lid 232 of FIG. 1. Each gas conduit 250A, 250B may be positioned at an angle $\alpha$ from the center line 302A, 302B of the gas conduit 250A, 250B and from a radius line 304 from the center of the expanding channel 234. Entry of a gas through the gas conduit 250A, 250B preferably positioned at an angle $\alpha$ (i.e., when $\alpha > 0°$) causes the gas to flow in a circular direction as shown by arrow 310A (or 310B). Providing gas at an angle $\alpha$ as opposed to directly straight-on to the walls of the expanding channel (i.e., when $\alpha = 0°$) helps to provide a more laminar flow through the expanding channel 234 rather than a turbulent flow. It is believed that a laminar flow through the expanding channel 234 results in an improved purging of the inner surface of the expanding channel 234 and other surfaces of the chamber lid 232. In comparison, a turbulent flow may not uniformly flow across the inner surface of the expanding channel 234 and other surfaces and may contain dead spots or stagnant spots in which there is no gas flow. In one aspect, the gas conduits 250A, 250B and the corresponding gas inlets 236A, 236B are spaced out from each other and direct a flow in the same circular direction (i.e., clockwise or counter-clockwise).

Figure 6:
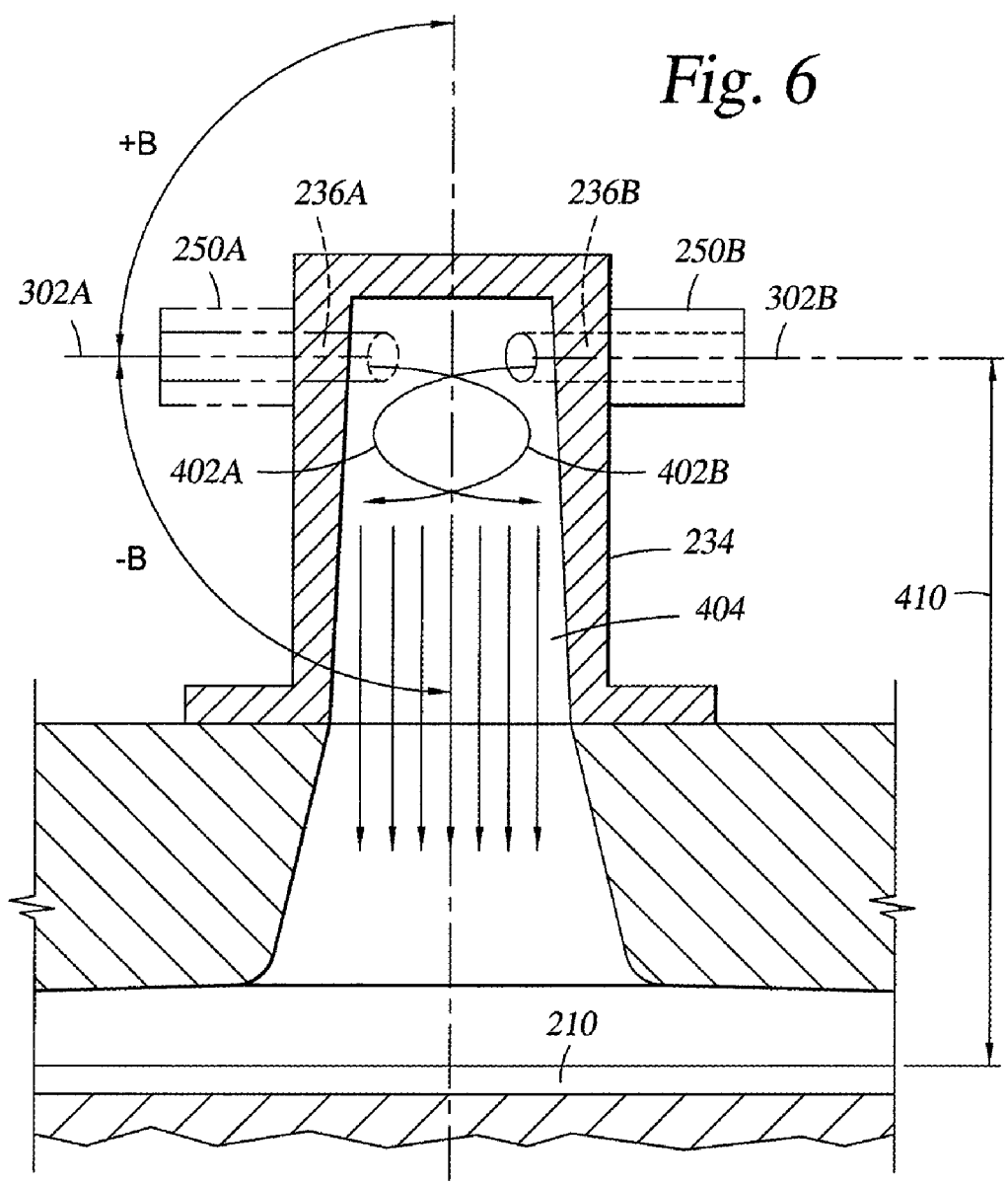
FIG. 6 is a cross-sectional view of the expanding channel of the chamber lid of FIG. 1.

Not wishing to be bound by theory, FIG. 6 is a cross-sectional view of the expanding channel 234 of a chamber lid 232 showing simplified representations of two gas flows therethrough. Although the exact flow pattern through the expanding channel 234 is not known, it is believed that the circular flow 310 (FIG. 6) may travel as a "vortex," "helix," or "spiral" flow 402A, 402B through the expanding channel 234 as shown by arrows 402A, 402B. As shown in FIG. 6, the circular flow may be provided in a "processing region" as opposed to in a compartment separated from the substrate 210. In one aspect, the vortex flow may help to establish a more efficient purge of the expanding channel 234 due to the sweeping action of the vortex flow pattern across the inner surface of the expanding channel 234.

In one embodiment, the distance 410 between the gas inlets 236A, 236B and the substrate 210 is made far enough that the "vortex" flow 402 dissipates to a downwardly flow as shown by arrows 404 as a spiral flow across the surface of the substrate 210 may not be desirable. It is believed that the "vortex" flow 402 and the downwardly flow 404 proceeds in a laminar manner efficiently purging the chamber lid 232 and the substrate 210. In one specific embodiment the distance 410 between the upper portion 237 of the expanding channel 234 and the substrate 210 is about 1.0 inches or more, more preferably about 2.0 inches or more. In one specific embodiment, the upper limit of the distance 410 is dictated by practical limitations. For example, if the distance 410 is very long, then the residence time of a gas traveling though the expanding channel 234 would be long, then the time for a gas to deposit onto the substrate would be long, and then throughput would be low. In addition, if distance 410 is very long, manufacturing of the expanding channel 234 would be difficult. In general, the upper limit of distance 410 may be 3 inches or more for a chamber adapted to process 200 mm diameter substrates or 5 inches or more for a chamber adapted to process 300 mm diameter substrates.

Referring to FIG. 1, at least a portion of the bottom surface 260 of the chamber lid 232 may be tapered from the expanding channel 234 to a peripheral portion of the chamber lid 232 to help provide an improved velocity profile of a gas flow from the expanding channel 234 across the surface of the substrate 210 (i.e., from the center of the substrate to the edge of the substrate). The bottom surface 260 may comprise one or more tapered surfaces, such as a straight surface, a concave surface, a convex surface, or combinations thereof. In one embodiment, the bottom surface 260 is tapered in the shape of a funnel.

Figure 7:
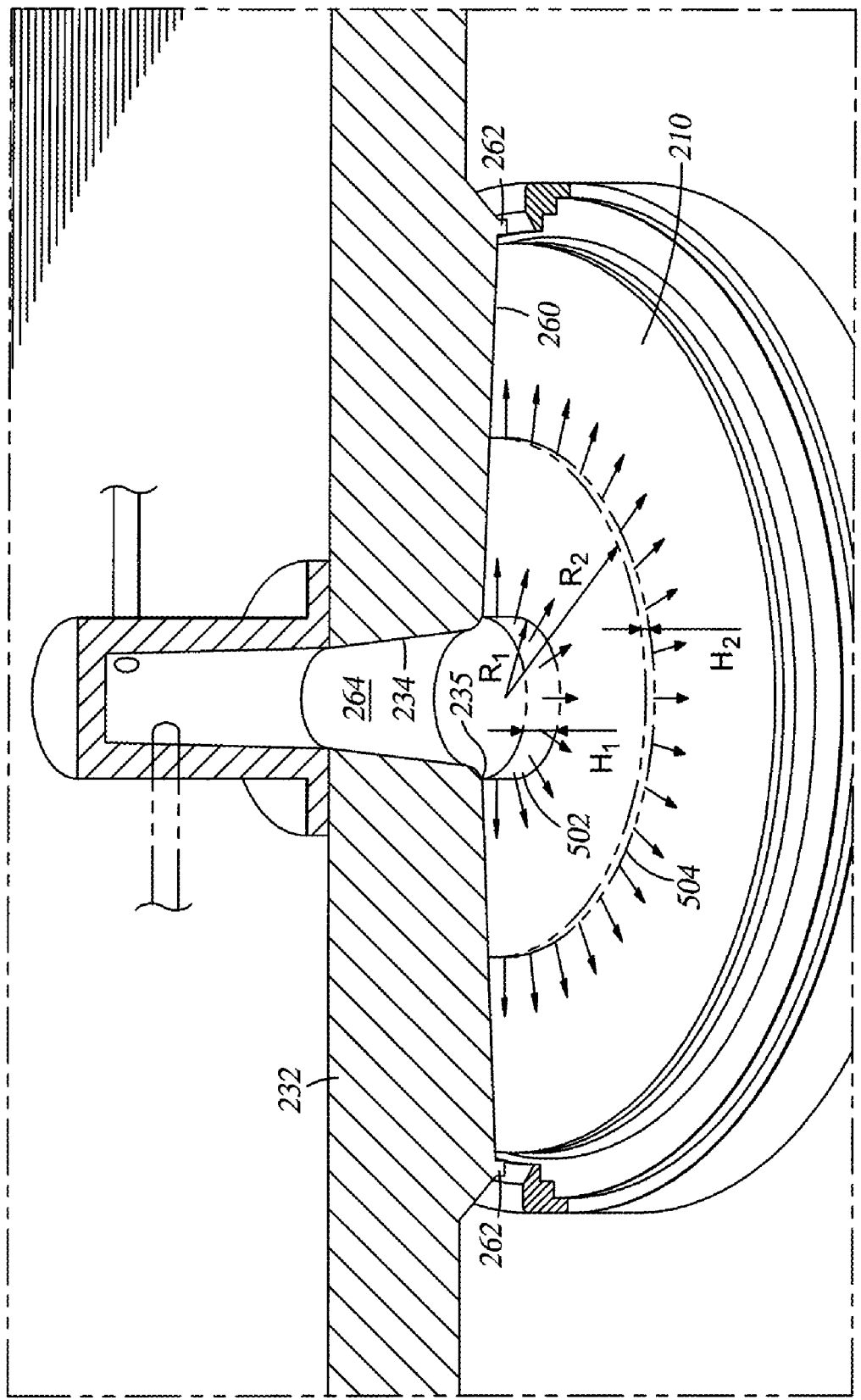
FIG. 7 is a schematic cross-sectional view illustrating the flow of a gas at two different positioned between the surface of a substrate and the bottom surface of the chamber lid of FIG. 1.

Not wishing to be bound by theory, FIG. 7 is schematic view illustrating the flow of a gas at two different positions 502, 504 between the bottom surface 260 of the chamber lid 232 and the surface of a substrate 210. The velocity of the gas at a certain position is theoretically determined by the equation below:

$$Q/A=V \qquad (1)$$

In which, "Q" is the flow of the gas, "A" is the area of the flow section, and "V" is the velocity of the gas. The velocity of the gas is inversely proportional to the area "A" of the flow section (H×2πR), in which "H" is the height of the flow section and "2πR" is the circumference of the flow section. In other words, the velocity of a gas is inversely proportional to the height "H" of the flow section and the radius "R" of the flow section.

Comparing the velocity of the flow section at position 502 and position 504, assuming that the flow "Q" of the gas at all positions between the bottom surface 260 of the chamber lid 232 and the surface of the substrate 210 is equal, the velocity of the gas may be theoretically made equal by having the area "A" of the flow sections equal. For the area of flow sections at position 502 and position 504 to be equal, the height $H_1$ at position 502 must be greater than the height $H_2$.

In one aspect, the bottom surface 260 is downwardly sloping to help reduce the variation in the velocity of the gases as it travels between the bottom surface 260 of the chamber lid 232 and the substrate 210 to help provide uniform exposure of the surface of the substrate 210 to a reactant gas. In one embodiment, the ratio of the maximum area of the flow section over the minimum area of the flow section between a downwardly sloping bottom surface 260 of the chamber lid 232 and the surface of the substrate 210 is preferably less than about 2, more preferably less than about 1.5, more preferably less than about 1.3, and most preferably about 1.

Not wishing to be bound by theory, it is believed that a gas flow traveling at a more uniform velocity across the surface of the substrate 210 helps provide a more uniform deposition of the gas on the substrate 210. It is believed that the velocity of the gas is directly proportional to the concentration of the gas which is in turn directly proportional to the deposition rate of the gas on the substrate surface. Thus, a higher velocity of a gas at a first area of the surface of the substrate versus a second area of the surface of the substrate is believed to provide a higher deposition of the gas on the first area. It is believed that a chamber lid having a downwardly sloping bottom surface 260 provides for more uniform deposition of the gas across the surface of the substrate because the downwardly sloping bottom surface provides a more uniform velocity and, thus, a more uniform concentration of the gas across the surface of the substrate.

Figure 9A:
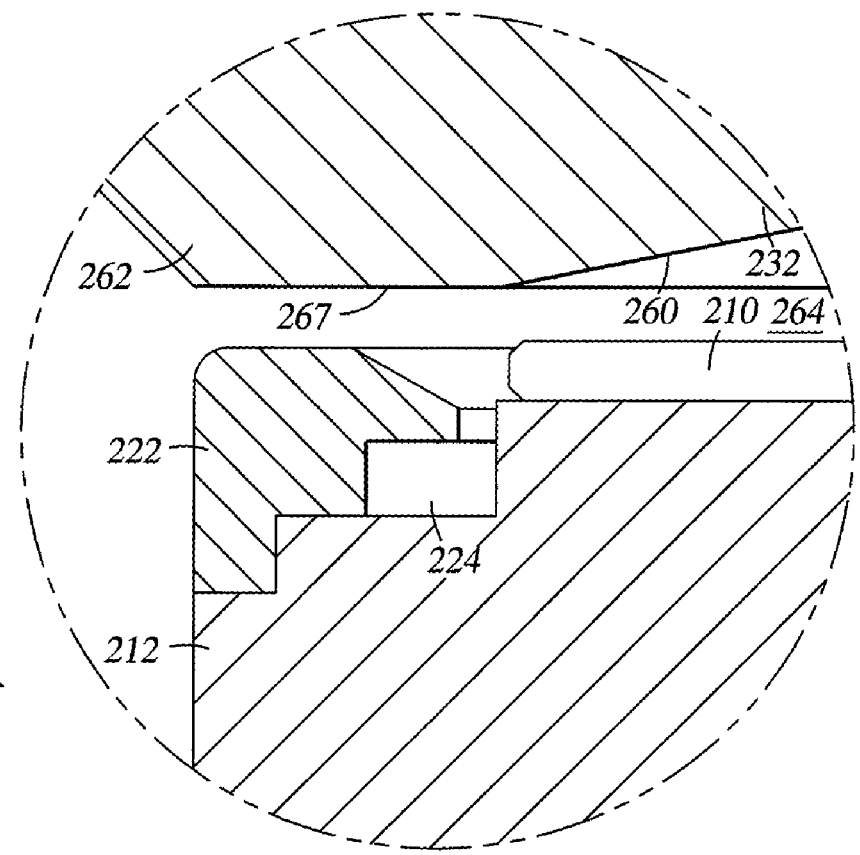
FIG. 9A is a schematic cross-sectional view of one embodiment of the choke of the chamber lid.
Figure 9B:
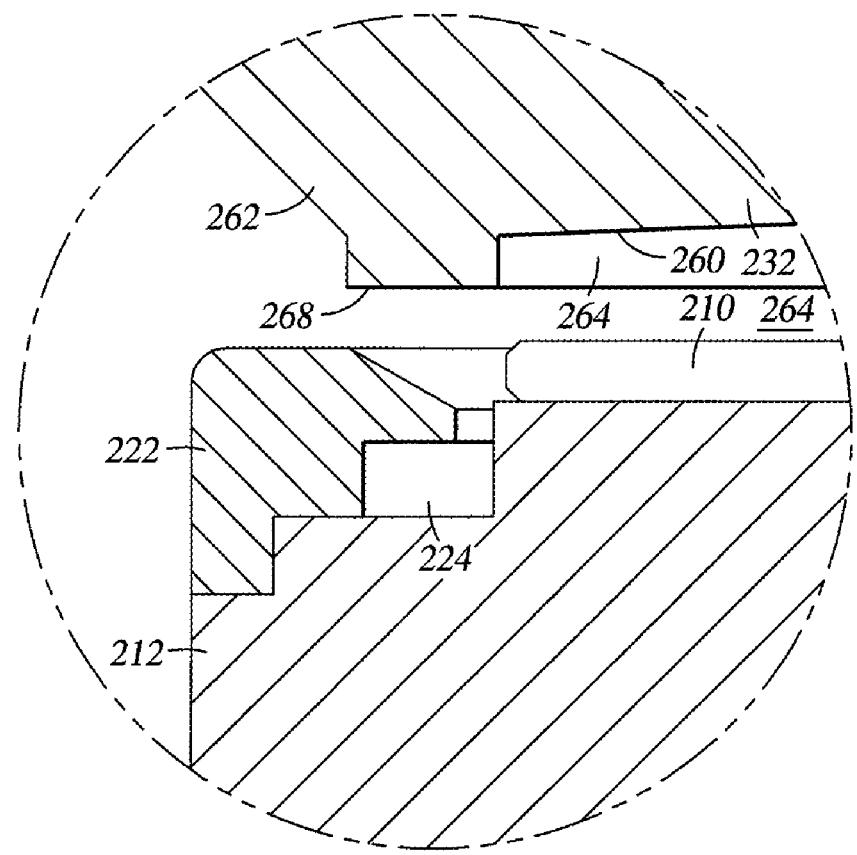
FIG. 9B is a cross-sectional view of another embodiment of the choke of the chamber lid.

Referring to FIG. 1, the chamber lid 232 may have a choke 262 at a peripheral portion of the chamber lid 232 adjacent the periphery of the substrate 210. The choke 262, when the chamber lid 232 is assembled to form a processing zone around the substrate 210, comprises any member restricting the flow of gas therethrough at an area adjacent the periphery of the substrate 210. FIG. 9A is a schematic cross-sectional view of one embodiment of the choke 262. In this embodiment, the choke 262 comprises a circumferential lateral portion 267. In one aspect, the purge ring 222 may be adapted to direct a purge gas toward the lateral portion 267 of the choke 262. FIG. 9B is a schematic cross-sectional view of another embodiment of the choke 262. In this embodiment, the choke 262 comprises a circumferential downwardly extending protrusion 268. In one aspect, the purge ring 222 may be adapted to direct a purge gas toward the circumferential downwardly extending protrusion 268. In one specific embodiment, the thickness of the downwardly extending protrusion 268 is between about 0.01 inches and about 1.0 inch, more preferably 0.01 inches and 0.5 inches.

In one specific embodiment, the spacing between the choke 262 and the substrate support 212 is between about 0.04 inches and about 2.0 inches, and preferably between 0.04 inches and about 0.2 inches. The spacing may vary depending on the gases being delivered and the process conditions during deposition. The choke 262 helps provide a more uniform pressure distribution within the volume or a reaction zone 264 defined between the chamber lid 232 and the substrate 210 by isolating the reaction zone 264 from the non-uniform pressure distribution of the pumping zone 266 (FIG. 1).

Referring to FIG. 1, in one aspect, since the reaction zone 264 is isolated from the pumping zone 266, a reactant gas or purge gas needs only adequately fill the reaction zone 264 to ensure sufficient exposure of the substrate 210 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of the substrate. In atomic layer deposition, the present chamber 200 sequentially introduces reactants to the substrate surface to provide absorption of alternating thin layers of the reactants onto the surface of the substrate. As a consequence, atomic layer deposition does not require a flow of a reactant which reaches the surface of the substrate simultaneously. Instead, a flow of a reactant needs to be provided in an amount which is sufficient to absorb a thin layer of the reactant on the surface of the substrate.

Since the reaction zone 264 may comprise a smaller volume when compared to the inner volume of a conventional CVD chamber, a smaller amount of gas is required to fill the reaction zone 264 for a particular process in an atomic layer deposition sequence. For example, in one embodiment, the volume of the reaction zone 264 is about 1000 cm$^3$ or less, preferably 500 cm$^3$ or less, and more preferably 200 cm$^3$ or less for a chamber adapted to process 200 mm diameter substrates. In one embodiment, the volume of the reaction zone 264 is about 3,000 cm$^3$ or less, preferably 1,500 cm$^3$ or less, and more preferably 600 cm$^3$ or less for a chamber adapted to process 300 mm diameter substrates. In one embodiment, the substrate support 212 may be raised or lowered to adjust the volume of the reaction zone 264 for deposition. Because of the smaller volume of the reaction zone 264, less gas, whether a deposition gas or a purge gas, is necessary to be flowed into the chamber 200. Therefore, the throughput of the chamber 200 is greater and the waste may be minimized due to the smaller amount of gas used reducing the cost of operation.

The chamber lid 232 has been shown as comprising a cap portion 272 and a chamber plate portion 270 in which the cap portion 272 and the chamber plate portion 270 form the expanding channel 234. An additional plate may be optionally disposed between the chamber lid portion 270 and the cap portion 272. In other embodiments, the expanding channel 234 may be made integrally from a single piece of material.

The chamber lid 232 may include cooling elements and/or heating elements depending on the particular gas being delivered therethrough. Controlling the temperature of the chamber lid 232 may be used to prevent gas decomposition, deposition, or condensation on the chamber lid 232. For example, water channels may be formed in the chamber lid 232 to cool the chamber lid 232. In another example, heating elements may be embedded or may surround components of the chamber lid 232 to heat the chamber lid 232. In one embodiment, components of the chamber lid 232 may be individually heated or cooled. For example, referring to FIG. 1, the chamber lid 232 may comprise a chamber plate portion 270 and a cap portion 272 in which the chamber plate portion 270 and the cap portion 272 form the expanding channel 234. The cap may be maintained at one temperature range and the chamber lid may be maintained at another temperature range. For example, the cap 272 may be heated by being wrapped in heater tape or by using another heating device to prevent condensation of reactant gases and the chamber plate portion 270 may be maintained at ambient temperature. In another example, the cap 272 may be heated and the chamber plate portion may be cooled with water channels formed therethrough to prevent thermal decomposition of reactant gases on the chamber plate portion 270.

The chamber lid 232 may be made of stainless steel, aluminum, nickel-plated aluminum, nickel, or other suitable materials compatible with the processing to be performed. In one embodiment, the cap portion 272 comprises stainless steel and the chamber plate portion 270 comprises aluminum. In one embodiment, the additional plate comprises stainless steel. In one embodiment, the expanding channel 234 and the bottom surface 260 of the chamber lid 232 may comprise a mirror polished surface to help produce a laminar flow of a gas along the expanding channel 234 and the bottom surface 260 of the chamber lid 232. In another embodiment, the inner surface of the gas conduits 250A, 250B may be electropolished to help produce a laminar flow of a gas therethrough.

Returning to FIG. 1, a control unit 280, such as a programmed personal computer, work station computer, or the like, may be coupled to the chamber 200 to control processing conditions. For example, the control unit 280 may be configured to control flow of various process gases and purge gases from gas sources 238, 239, 240 through the valves 242A, 242B during different stages of a substrate process sequence. Illustratively, the control unit 280 comprises a central processing unit (CPU) 282, support circuitry 284, and memory 286 containing associated control software 283.

The control unit 280 may be one of any form of general purpose computer processor that can be used in an industrial setting for controlling various chambers and sub-processors. The CPU 282 may use any suitable memory 286, such as random access memory, read only memory, floppy disk drive, hard disk, or any other form of digital storage, local or remote. Various support circuits may be coupled to the CPU 282 for supporting the chamber 200. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 1. In addition to control of process gases and purge gases from gas sources 238, 239, 240 and from the programmable logic controllers 248A, 248B of the valves 242A, 242B, the control unit 280 may be configured to be responsible for automated control of other activities used in wafer processing—such as wafer transport, temperature control, chamber evacuation, among other activities, some of which are described elsewhere herein.

In operation, a substrate 210 is delivered to the chamber 200 through the opening 208 by a robot (not shown). The substrate 210 is positioned on the substrate support 212 through cooperation of the lift pins 220 and the robot. The substrate support 212 raises the substrate 210 into close opposition to the bottom surface 260 of the chamber lid 232. A first gas flow may be injected into the expanding channel 234 of the chamber 200 by valve 242A together or separately (i.e. pulses) with a second gas flow injected into the chamber 200 by valve 242B. The first gas flow may comprise a continuous flow of a purge gas from purge gas source 240 and pulses of a reactant gas from reactant gas source 238 or may comprise pulses of a reactant gas from reactant gas source 238 and pulses of a purge gas from purge gas source 240. The second gas flow may comprise a continuous flow of a purge gas from purge gas source 240 and pulses of a reactant gas from reactant gas source 239 or may comprise pulses of a reactant gas from reactant gas source 239 and pulses of a purge gas from purge gas source 240. The gas flow travels through the expanding channel 234 as a vortex flow pattern 402 which provides a sweeping action across the inner surface of the expanding channel 234. The vortex flow pattern 402 dissipates to a downwardly flow 404 toward the surface of the substrate 210. The velocity of the gas flow reduces as it travels through the expanding channel 234. The gas flow then travels across the surface of the substrate 210 and across the bottom surface 260 of the chamber lid 232. The bottom surface 260 of the chamber lid 232, which is downwardly sloping, helps reduce the variation of the velocity of the gas flow across the surface of the substrate 210. The gas flow then travels by the choke 262 and into the pumping zone 266 of the chamber 200. Excess gas, by-products, etc. flow into the pumping channel 279 and are then exhausted from the chamber 200 by a vacuum system 278. In one aspect, the gas flow proceeds through the expanding channel 234 and between the surface of the substrate 210 and the bottom surface 260 of the chamber lid 232 in a laminar manner which aids in uniform exposure of a reactant gas to the surface of the substrate 210 and efficient purging of inner surfaces of the chamber lid 232.

Chamber 200 has been described herein as having a combination of features. In one aspect, chamber 200 provides a reaction zone comprising a small volume in compared to a conventional CVD chamber. The chamber 200 requires a smaller amount of a gas, such as a reactant gas or a purge gas, to fill the reaction zone for a particular process. In another aspect, chamber 200 provides a chamber lid having a downwardly sloping or funnel shaped bottom surface to reduce the variation in the velocity profile of a gas flow traveling between the bottom surface of the chamber lid and a substrate. In still another aspect, the chamber 200 provides an expanding channel to reduce the velocity of a gas flow introduced therethrough. In still another aspect, the chamber 200 provides gas conduits at an angle α from the center of the expanding channel. The chamber 200 provides other features as described elsewhere herein. Other embodiments of a chamber adapted for atomic layer deposition incorporate one or more of these features.

Figure 8:
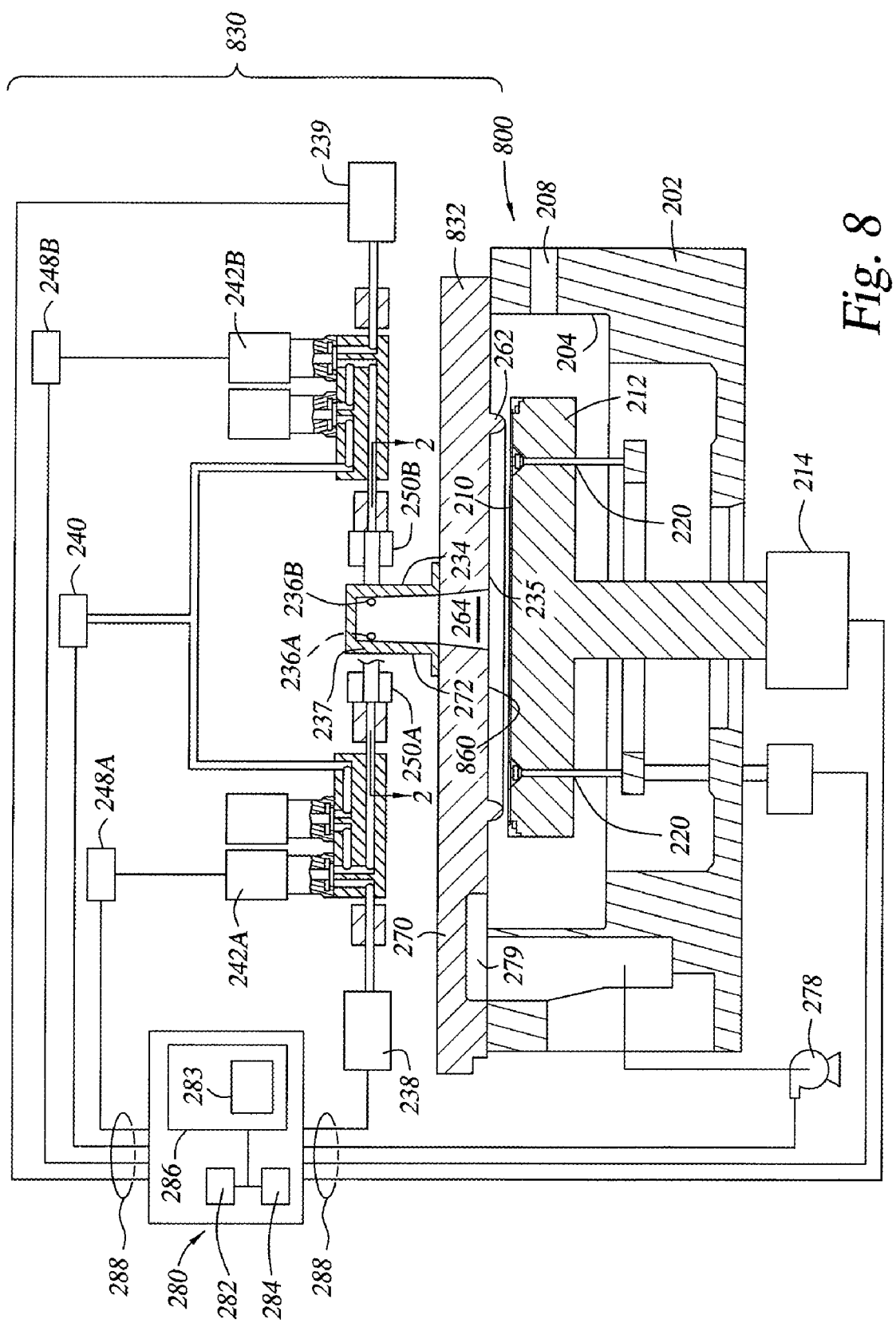
FIG. 8 is a schematic cross-sectional view of another embodiment of a camber including a gas delivery apparatus adapted for atomic layer deposition.

For example, FIG. 8 shows another embodiment of a chamber 800 including a gas delivery apparatus 830 comprising a chamber lid 832 which provides a reaction zone comprising a small volume and which provides an expanding channel. Some components of the chamber 800 are the same or similar to those described with reference to chamber 200 of FIG. 1, described above. Accordingly, like numbers have been used where appropriate. The chamber lid 832 comprises a bottom surface 860 that is substantially flat. In one embodiment, the spacing between the choke 262 and the substrate support 210 is between about 0.04 inches and about 2.0 inches, more preferably between about 0.04 inches and about 0.2 inches.

The gas delivery apparatus 230 of FIG. 1 has been described as including two valves 242A, 242B coupled to a reactant gas source and a purge gas source. In other embodiments, the gas delivery apparatus 230 may comprise one or more valves coupled to a single or a plurality of gas sources in a variety of configurations. FIGS. 1, 5, and 6 show a chamber 200 adapted to provide two gas flows together or separately from two gas inlets 236A, 236B utilizing two valves 242A, 242B.

The processing chamber 200 may be integrated into an integrated processing platform, such as an Endura™ platform also available from Applied Materials, Inc. Details of the Endura™ platform are described in commonly assigned U.S. patent application Ser. No. 09/451,628, entitled "Integrated Modular Processing Platform", filed on Nov. 30, 1999, which is incorporated by reference herein.

The chamber 200 includes a chamber body 202 having a slit valve 208 formed in a sidewall 204 thereof and a substrate support 212 disposed therein. The substrate support 212 is mounted to a lift motor 214 to raise and lower the substrate support 212 and a substrate 210 disposed thereon. The substrate support 212 may also include a vacuum chuck, an electrostatic chuck, or a clamp ring for securing the substrate 212 to the substrate support 212 during processing. Further, the substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 that provides a purge gas to prevent deposition on a peripheral portion of the substrate 210.

A gas delivery apparatus 230 is disposed at an upper portion of the chamber body 202 to provide a gas, such as a process gas and/or a purge gas, to the chamber 200. A vacuum system 278 is in communication with a pumping channel 279 to evacuate gases from the chamber 200 and to help maintain a desired pressure or a desired pressure range inside a pumping zone 266 of the chamber 200.

The gas delivery apparatus 230 includes a chamber lid 232 having an expanding channel 234 formed within a central portion thereof. The chamber lid 232 also includes a bottom surface 260 extending from the expanding channel 234 to a peripheral portion of the chamber lid 232. The bottom surface 260 is sized and shaped to substantially cover the substrate 210 disposed on the substrate support 212. The expanding channel 234 has an inner diameter that gradually increases from an upper portion 237 to a lower portion 235 adjacent the bottom surface 260 of the chamber lid 232. The velocity of a gas flowing therethrough decreases as the gas flows through the expanding channel 234 due to the expansion of the gas. The decreased gas velocity reduces the likelihood of blowing off reactants adsorbed on the surface of the substrate 210.

The gas delivery apparatus 230 also includes at least two high speed actuating valves 242 having one or more ports. At least one valve 242 is dedicated to each reactive compound. For example, a first valve is dedicated to a refractory metal-containing compound, such as tantalum and titanium, and a second valve is dedicated to a nitrogen-containing compound. When a ternary material is desired, a third valve is dedicated to an additional compound, such as a silicon-containing compound if a silicide is desired.

The valves 242 may generally be any type of valve capable of reliably, repeatedly, and precisely metering the desired precursors at the desired rate of introduction. In some cases, dosing may be as fast as 1-2 milliseconds (msec). As one example, the valves 242 may be electronically controlled (EC) valves, which are commercially available from Fujikin of Japan as part number FR-21-6.35 UGF-APD. The valves 242 precisely and repeatedly deliver short pulses of the reactive compounds into the chamber body 202. The on/off cycles or pulses of the valves 242 are less than about 100 msec. The valves 242 can be directly controlled by a system computer, such as a mainframe for example, or controlled by a chamber/application specific controller, such as a programmable logic computer (PLC) which is described in more detail in the co-pending U.S. patent application Ser. No. 09/800,881, entitled "Valve Control System For ALD Chamber", filed on Mar. 7, 2001, which is incorporated by reference herein.

An exemplary process for forming a TaN barrier layer on a 200 mm wafer using a cyclical deposition process of alternate/sequential pulses of PDMAT and ammonia is described below. The process may be performed within a processing chamber, such as the processing chamber 200 described in FIG. 1. PDMAT is a preferred tantalum-containing compound for a number of reasons. PDMAT is relatively stable, and has a vapor pressure which makes it easy to deliver. PDMAT may also be produced with a low halide content, such as less than 100 ppm, and may even be produced with a halide content of less than 30 ppm or even less than 5 ppm. Not wishing to be bound by theory, it is believed that an organo-metallic precursor with a low halide content is beneficial because halides (such as chlorine) incorporated in the barrier layer may attack the copper layer deposited thereover.

To deposit the TaN layer, an inert/purge gas such as argon is first introduced into the processing chamber 200 to stabilize the pressure and temperature therein. This separate flow of gas flows continuously during the deposition process such that only the separate flow of gas flows between pulses of each compound. After the chamber pressure and temperature have been stabilized between about 200° C. and about 300° C. at about 1 Torr to about 5 Torr, a first pulse of PDMAT is provided from the gas source 238 at a flow rate between about between about 100 sccm and about 400 sccm, with a pulse time of about 0.6 seconds or less. A pulse of ammonia is then provided from the gas source 239 at a flow rate between about 200 sccm and about 600 sccm, with a pulse time of about 0.6 seconds or less.

A pause between pulses of PDMAT and ammonia is about 1.0 second or less, about 0.5 seconds or less, or about 0.1 seconds or less. A pause after the pulse of ammonia is also about 1.0 second or less, about 0.5 seconds or less, or about 0.1 seconds or less. Argon gas flowing between about 100 sccm and about 1,000 sccm, such as between about 100 sccm and about 400 sccm, is continuously provided from the gas source 240 through each valve 242. In one aspect, at least a portion of a pulse of PDMAT may still be in the chamber when at a least a portion of a pulse of ammonia enters so that some co-reaction or gas phase co-reaction takes place. In another aspect, the duration of the purge gas and/or pump evacuation is designed to prevent the pulses of PDMAT and ammonia from mixing together in the reaction zone.

The heater temperature is maintained between about 100° C. and about 300° C. at a chamber pressure between about 1.0 and about 5.0 Torr. Each cycle consisting of a pulse of PDMAT, pause, pulse of ammonia, and pause provides a tantalum nitride layer having a thickness between about 0.3 Å and about 1.0 Å per cycle. The alternating sequence may be repeated until the desired thickness is achieved, which is less than about 20 Å, such as about 10 Å. Accordingly, the deposition method requires between 10 and 70 cycles, more typically between 20 and 30 cycles.

A similar deposition method is used to deposit a barrier layer consisting of titanium silicon nitride. Each cycle consists of a pulse of a titanium-containing compound, a pause, a pulse of a silicon-containing compound, a pause, a pulse of a nitrogen-containing compound, and a pause. In one aspect, each cycle consists of a pulse of TDMAT, a first pause, a pulse of silane, a second pause, a pulse of ammonia, and a third pause.

To initiate the cyclical deposition of a $Ti_xSi_yN$ layer, argon is introduced into the processing chamber 200 to stabilize the chamber pressure between about 1 Torr and about 5 Torr and the chamber temperature between about 200° C. and about 300° C. This separate flow of argon flows continuously during the deposition process such that only the argon flows between pulses of each compound. The separate flow of argon flows between about 100 sccm and about 1,000 sccm, such as between about 100 sccm and about 400 sccm.

After the chamber pressure and temperature have been stabilized at about 250° C. and 5 Torr, a pulse of TDMAT is provided at a flow rate between about 10 sccm and about 1,000 sccm, with a pulse time of about 0.6 seconds or less. A pulse of silane is then provided at a flow rate between about 5 sccm and about 500 sccm, with a pulse time of about 1 second or less. A pulse of ammonia is then provided at a flow rate between about 100 sccm and about 5,000 sccm, with a pulse time of about 0.6 seconds or less.

A pause between pulses of TDMAT and silane is about 1.0 second or less, about 0.5 seconds or less, or about 0.1 seconds or less. A pause between pulses of silane and ammonia is about 1.0 second or less, about 0.5 seconds or less, or about 0.1 seconds or less. A pause after the pulse of ammonia is also about 1.0 second or less, about 0.5 seconds or less, or about 0.1 seconds or less. In one aspect, a pulse of TDMAT may still be in the chamber when a pulse of silane enters, and a pulse of silane may still be in the chamber when a pulse of ammonia enters.

The heater temperature is maintained between about 100° C. and about 300° C. at a chamber pressure between about 1.0 and about 5.0 Torr. Each cycle consisting of a pulse of TDMAT, pause, pulse of silane, pause, pulse of ammonia, and pause provides a titanium silicon nitride layer having a thickness between about 0.3 Å and about 1.0 Å per cycle. The alternating sequence may be repeated until the desired thickness is achieved, which is less than about 20 Å, such as about 10 Å. Accordingly, the deposition method requires between 10 and 70 cycles.

Figure 2A:
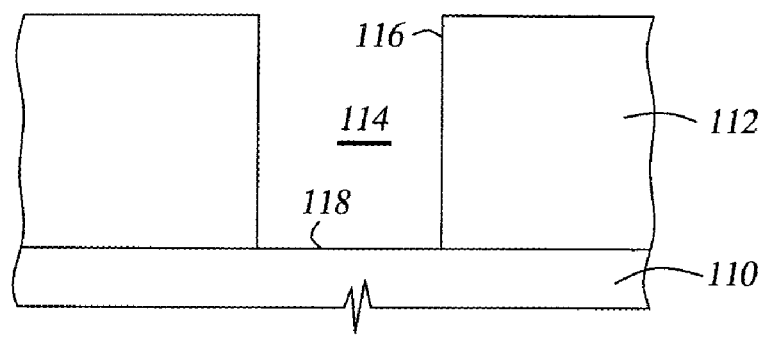
FIGS. 2A-2D illustrate steps for forming a metal interconnect in accordance with embodiments of a cycled deposition technique described herein.

FIGS. 2A-2D are cross sectional views of a wafer at different stages of a multi-layer metal interconnect fabrication sequence incorporating a thin barrier layer deposited using a cyclical deposition process described herein. FIG. 2A shows a lower level metal interconnect 110 having a dielectric layer 112 formed thereon. The dielectric layer 112 may be any dielectric material including a low k dielectric material, whether presently known or yet to be discovered. For example, the dielectric layer 112 may be a silicon oxide or a carbon doped silicon oxide, for example. The dielectric layer 112 has been etched to form a feature 114 therein using conventional and well-known techniques. The feature 114 may be a plug, via, contact, line, wire, or any other interconnect facet. The feature 114 has vertical sidewalls 116 and a bottom 118, typically having an aspect ratio of 4:1 or greater, such as 6:1. The bottom 118 exposes at least a portion of the lower level metal interconnect 110.

Figure 2B:
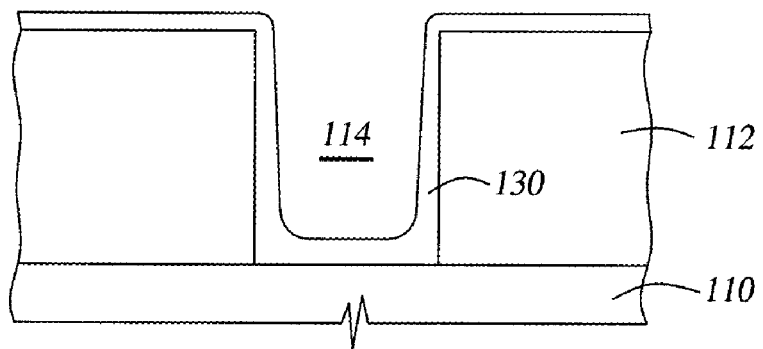

Referring to FIG. 2B, a barrier layer 130 is deposited using the techniques described above on the bottom 118 as well as the side walls 116 of the feature 114. The barrier layer 130 has a thickness less than about 20 Å, preferably about 10 Å. The barrier layer may be a binary material or a ternary material as discussed above.

Optionally, the patterned or etched substrate dielectric layer 112 may be cleaned to remove native oxides or other contaminants from the surface thereof prior to depositing the barrier layer 130. For example, reactive gases may be excited into a plasma within a remote plasma source chamber and delivered to the processing chamber 200. An exemplary remote plasma chamber is a Reactive Pre-clean II chamber available from Applied Materials, Inc., located in Santa Clara, Calif. Alternatively, the processing chamber 200 may be modified to deliver the pre-cleaning gas plasma through existing gas inlets.

In one aspect, the reactive pre-clean process forms radicals from a plasma of one or more reactive gases such as argon, helium, hydrogen, nitrogen, fluorine-containing compounds, and combinations thereof. For example, a reactive gas may include a mixture of tetrafluorocarbon ($CF_4$) and oxygen ($O_2$), or a mixture of helium (He) and nitrogen trifluoride ($NF_3$).

The plasma is typically generated by applying a power of about 500 to 2,000 watts RF at a frequency of about 200 KHz to 114 MHz. The flow of reactive gases ranges between about 100 and about 1,000 sccm and the plasma treatment lasts for about 10 to about 150 seconds. Preferably, the plasma is generated in one or more treatment cycles and purged between cycles. For example, four treatment cycles lasting 35 seconds each is effective.

In another aspect, the patterned or etched dielectric layer 112 may be pre-cleaned first using an argon plasma and then a hydrogen plasma. A processing gas having greater than about 50% argon by number of atoms is introduced at a pressure of about 0.8 mTorr. A plasma is struck to subject the dielectric layer 112 to an argon sputter cleaning environment. The argon plasma is preferably generated by applying between about 50 watts and about 500 watts of RF power. The argon plasma is maintained for between about 10 seconds and about 300 seconds to provide sufficient cleaning time for the deposits that are not readily removed by a reactive hydrogen plasma. Following the argon plasma, the chamber pressure is increased to about 140 mTorr, and a processing gas consisting essentially of hydrogen and helium is introduced into the processing region. Preferably, the processing gas comprises about 5% hydrogen and about 95% helium. The hydrogen plasma is generated by applying between about 50 watts and about 500 watts power. The hydrogen plasma is maintained for about 10 seconds to about 300 seconds.

Figure 2C:
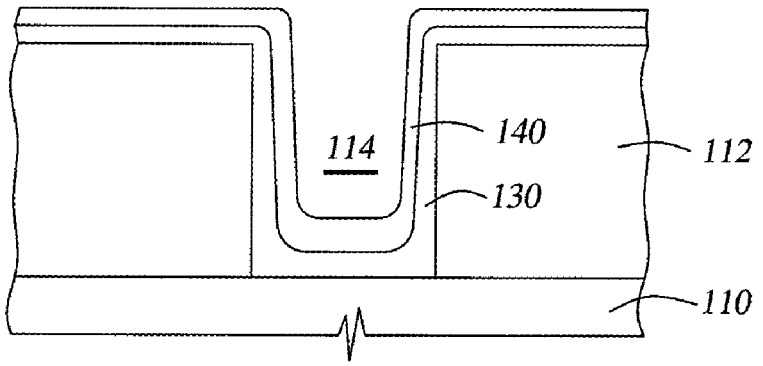
Figure 2D:
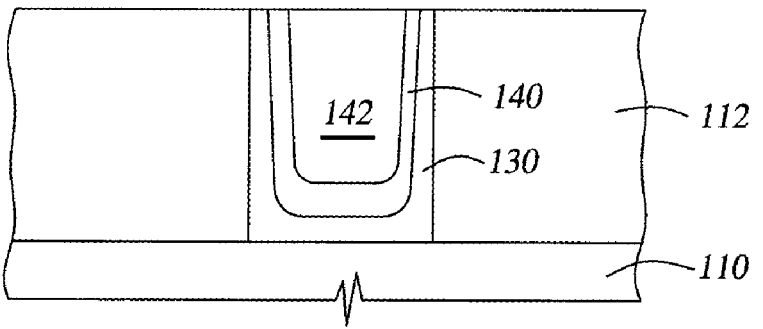

Referring to FIGS. 2C and 2D, a metal, metal alloy, or a combination thereof is deposited over the barrier layer 130 to at least partially fill the feature 114. In one aspect, a metal seed layer 140 of a copper-containing material is first deposited having a thickness of about 1,000 Å to about 2,000 Å. Next, a copper metal layer 142 is deposited over the seed layer 140 to fill the feature 114.

In one aspect, the copper-containing seed layer 140 is deposited using high density plasma physical vapor deposition (HDP-PVD) to enable good conformal coverage. One example of a HDP-PVD chamber is the Ionized Metal Plasma (IMP) Vectra™ chamber, available from Applied Materials, Inc. of Santa Clara, Calif. The IMP chamber may also be integrated into an Endura™ platform, also available from Applied Materials, Inc. Of course, other techniques, such as physical vapor deposition, chemical vapor deposition, electroless plating, and electroplating, may be used.

The IMP chamber includes a target, coil, and biased substrate support member. To form the copper seed layer 140, a power between about 0.5 kW and about 5 kW is applied to the target, and a power between about 0.5 kW and 3 kW is applied to the coil. A power between about 200 and about 500 W at a frequency of about 13.56 MHz is applied to bias the substrate. Argon is flowed into the chamber at a rate of about 35 sccm to about 85 sccm, and nitrogen may be added to the chamber at a rate of about 5 sccm to about 100 sccm. The substrate support member is heated to a temperature between about 50° C. and 250° C. as the pressure of the chamber is typically between about 5 mTorr to about 100 mTorr.

Referring to FIG. 2D, the copper metal layer 142 may be deposited over the copper seed layer 140 using CVD, PVD, electroless, or electroplating techniques. In one aspect, the copper layer 142 is formed using an electroplating cell, such as the Electra™ Cu ECP system, available from Applied Materials, Inc., of Santa Clara, Calif. The Electra™ Cu ECP system may also be integrated into an Endura™ platform also available from Applied Materials, Inc. A copper electrolyte solution and copper electroplating technique is described in commonly assigned U.S. Pat. No. 6,113,771, entitled "Electro-deposition Chemistry", which is incorporated by reference herein. Typically, the electroplating bath has a copper concentration greater than about 0.7M, a copper sulfate concentration of about 0.85, and a pH of about 1.75. The electroplating bath may also contain various additives as is well known in the art. The temperature of the bath is between about 15° C. and about 25° C. The bias is between about −15 volts to about 15 volts. In one aspect, the positive bias ranges from about 0.1 volts to about 10 volts and the negative bias ranges from about −0.1 to about −10 volts.

Optionally, an anneal treatment may be performed following copper deposition whereby the wafer is subjected to a temperature between about 100° C. and about 400° C. for about 10 minutes to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The RF power is about 200 W to about 1,000 W at a frequency of about 13.56 MHz, and the preferable substrate spacing is between about 300 mils and about 800 mils.

Following deposition, the top portion of the resulting structure may be planarized following the copper metal deposition. A chemical mechanical polishing (CMP) apparatus may be used, such as the Mirra™ System available from Applied Materials, Santa Clara, Calif., for example. For example, portions of the copper 140 and the dielectric 112 are removed from the top of the structure leaving a fully planar surface. Optionally, the intermediate surfaces of the structure may be planarized between the deposition of the subsequent layers described above.

As stated above, the processing steps of the embodiments described herein may be performed in an integrated processing platform such as the Endura™ platform available from Applied Materials, Inc. of Santa Clara, Calif. To facilitate the control and automation of the overall system, the integrated processing system may include a controller 140 comprising a central processing unit (CPU) 142, memory 144, and support circuits 146. The CPU 142 may be one of any form of computer processors that are used in industrial settings for controlling various drives and pressures. The memory 144 is connected to the CPU 142, and may be one or more of a readily available memory such as random access memory (RAM), read only memory (ROM), floppy disk, hard disk, or any other form of digital storage, local or remote. Software instructions and data can be coded and stored within the memory 144 for instructing the CPU 142. The support circuits 146 are also connected to the CPU 142 for supporting the processor 142 in a conventional manner. The support circuits 146 may include cache, power supplies, clock circuits, input/output circuitry, subsystems, and the like.

Figure 3:
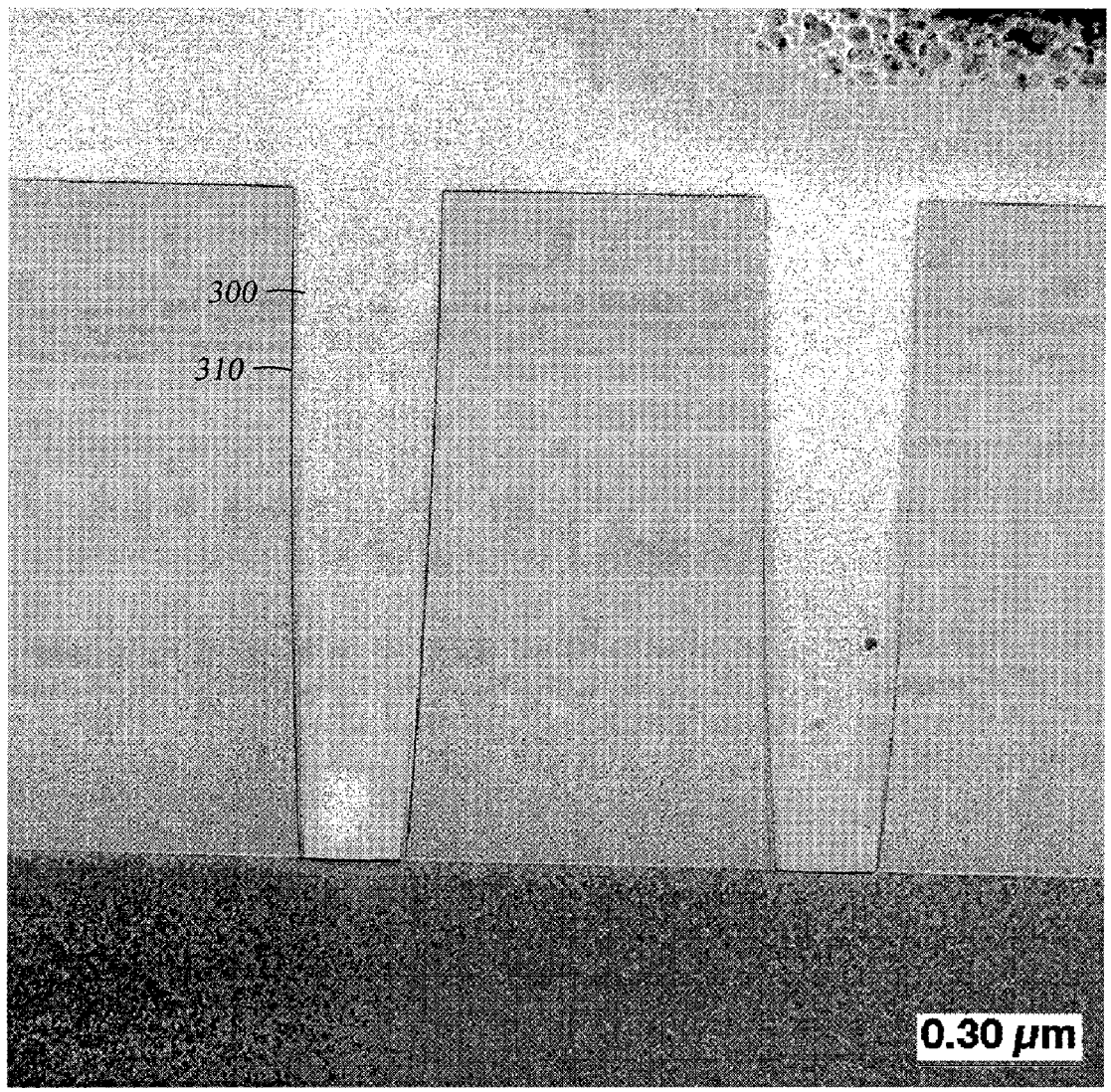
FIG. 3 is a TEM image of a metal interconnect having a barrier layer deposited in accordance with embodiments of a cyclical deposition technique described herein.

FIG. 3 is a transmission electron microscope (TEM) image of a feature 300 having a titanium nitride barrier layer 310 deposited therein according to the deposition techniques described above. The feature 300 had an aspect ratio of 5:1 and was formed on a 200 mm wafer. The barrier layer 310 consisted of tantalum nitride and was deposited at 250° C. and 2 Torr. Each cycle lasted about 2 seconds and 30 cycles were performed. The tantalum nitride barrier layer 310 had a thickness of about 15 angstroms. As shown, the barrier layer 310 is conformal and shows good step coverage throughout the entire feature 300.

Figure 4:
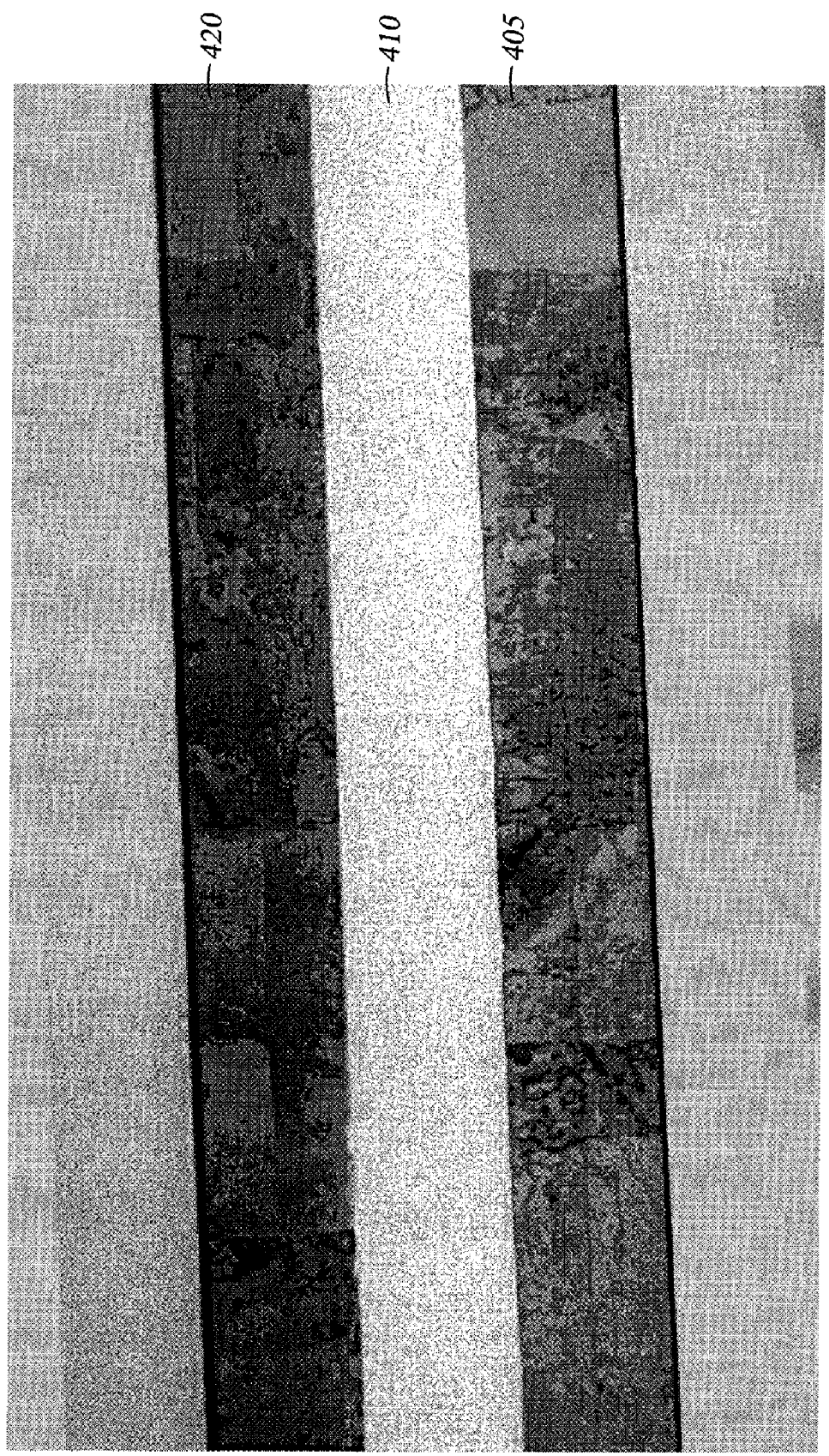
FIG. 4 is a TEM image showing a continuous copper grain growth across a barrier layer deposited in accordance with embodiments of a cyclical deposition technique described herein.

FIG. 4 is a TEM image showing a partial cross sectional view of a multi-level, interconnect structure 400. The multi-level, interconnect structure 400 included a lower level copper interconnect 405, a tantalum nitride barrier layer 410, and an upper level copper interconnect 420. As shown, the copper grain growth of the lower level copper interconnect 405 extended across the barrier layer 410 into the upper level copper interconnect 420. The barrier layer 410 consisted of tantalum nitride and was deposited at 250° C. and 2 Torr. Each cycle lasted about 2 seconds and 30 cycles were performed. The barrier layer 410 had a thickness of about 10 angstroms, which was sufficient to inhibit copper migration into the dielectric material, but not establish a growth pattern of its own.

It is believed that a refractory metal nitride layer having a thickness greater than about 20 angstroms will terminate the growth pattern of the lower level metal interconnect. A refractory metal nitride layer having a thickness of about 20 angstroms or more will establish a distinct growth pattern of its own, which would be initially adopted by the higher interconnect until the higher interconnect reaches a particular thickness and establishes its own pattern, thereby forming a different crystal structure. This phenomenon occurs because a growth pattern of a subsequently deposited layer typically resembles a growth pattern of an underlying layer during its initial stages of deposition, but the subsequent layer then takes on its own, inherent pattern once the subsequent layer reaches a particular thickness.

Tantalum nitride, for example, has a natural inclination to form an amorphous structure at about 20 angstroms or more. Below about 20 angstroms, TaN resembles the growth pattern of its underlying layer. Therefore, a subsequent copper interconnect layer was surprisingly grown across a barrier layer deposited according to the methods of the present invention exhibiting a similar growth pattern as the underlying copper interconnect.

The barrier layers 310, 410 shown and described with reference to FIGS. 3 and 4 were measured using a TEM instrument. It can be appreciated that a margin of error is present with this kind of measurement technique as well as any other measurement technique for determining a thickness of a deposited layer. Therefore, the thicknesses provided herein are approximate and quantified according to the best available known techniques and are not intended to limit the scope of the present invention.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
   precleaning a dielectric layer on a substrate;
   positioning the substrate in a chamber, the chamber having a chamber lid having an expanding channel, a bottom surface coupled with the expanding channel, and one or more gas conduits coupled with the expanding channel, wherein each of the one or more gas conduits is connected to a sidewall of the expanding channel and is positioned in a non-linear manner with respect to a center of the expanding channel and to other gas conduits to introduce a process gas into the expanding channel in a vortex, helix, or spiral flow pattern, and wherein the bottom surface is tapered from the expanding channel to a peripheral portion of the chamber lid and is sized and shaped to substantially cover the substrate;
   forming a barrier layer on the substrate by flowing the process gas into the expanding channel in a manner to form the vortex, helix, or spiral flow pattern which provides a sweeping action across an inner surface of the expanding channel, the vortex, helix, or spiral flow pattern being dissipated while traveling through the expanding channel to a downwardly gas flow toward and across a surface of the substrate in a laminar manner, and sequentially pulsing reagents into the gas during an atomic layer deposition, wherein the atomic layer deposition comprises introducing one or more pulses of a metal-containing precursor and a nitrogen-containing precursor to the expanding channel; and
   depositing a seed layer on the barrier layer.

2. The method of claim 1, wherein the nitrogen-containing precursor is selected from the group consisting of nitrogen gas, ammonia, hydrazine, methylhydrazine, dimethlyhydrazine, t-butylhydrazine, phenylhydrazine, azotertbutane, ethylazide, derivatives thereof, and combinations thereof.

3. The method of claim 1, wherein the metal-containing precursor is selected from the group consisting of pentaethyl methylamino-tantalum (PEMAT), pentadiethylamino-tantalum (PDEAT), pentadimethylamino-tantalum (PDMAT), t-butylimino tris(diethylamino)tantalum (TBTDET), t-butylimino tris(dimethylamino)tantalum (TBTDMT), bis(cyclopentadienyl)tantalum trihydride, bis (methylcyclopentadienyl)tantalum trihydride, tantalum fluoride, tantalum bromide, tantalum chloride, derivatives thereof, and combinations thereof.

4. The method of claim 1, wherein the metal-containing precursor is selected from the group consisting of tetrakis (dimethylamino)titanium (TDMAT), tetrakis(ethylmethylamino)titanium (TEMAT), tetrakis(diethylamino)titanium (TDEAT), titanium tetrachloride ($TiCl_4$), titanium iodide ($TiI_4$), titanium bromide ($TiBr_4$), and derivatives thereof.

5. The method of claim 1, wherein the atomic layer deposition further comprises:
   alternately pulsing a metal-containing precursor, a silicon-containing precursor, and a nitrogen-containing precursor until a refractory metal silicon nitride layer having a thickness less than about 20 angstroms is deposited over at least a portion of a substrate surface.

6. The method of claim 5, wherein the silicon-containing precursor is selected from the group consisting of silane, disilane, methylsilane, dimethylsilane, chlorosilane ($SiH_3Cl$), dichlorosilane ($SiH_2Cl_2$), trichlorosilane ($SiHCl_3$), and combinations thereof.

7. A method for processing a substrate, comprising:
   precleaning a dielectric layer on a substrate;
   positioning the substrate in a chamber, the chamber having a chamber lid having an expanding channel, a bottom surface coupled with the expanding channel, and a plurality of gas conduits coupled to a sidewall of the expanding channel, wherein each gas conduit is positioned in a non-linear manner with respect to a center of the expanding channel and to other gas conduits to introduce a process gas into the expanding channel in a circular flow pattern, and the bottom surface is tapered from the expanding channel to a peripheral portion of the chamber lid and is sized and shaped to substantially cover the substrate;
   forming a barrier layer on the substrate by flowing the process gas into the expanding channel in a manner to form the circular flow pattern which provides a sweeping action across an inner surface of the expanding channel, the circular flow pattern being dissipated while traveling through the expanding channel to a downwardly gas flow toward and across a surface of the substrate in a laminar manner, and sequentially pulsing reagents into the gas during an atomic layer deposition, wherein the atomic layer deposition comprises introducing one or more pulses of a metal-containing precursor and a nitrogen-containing precursor to the expanding channel; and
   depositing a seed layer on the barrier layer.

8. The method of claim 7, wherein the nitrogen-containing precursor is selected from the group consisting of nitrogen gas, ammonia, hydrazine, methylhydrazine, dimethlyhydrazine, t-butylhydrazine, phenylhydrazine, azotertbutane, ethylazide, derivatives thereof, and combinations thereof.

9. The method of claim 7, wherein the metal-containing precursor is selected from the group consisting of pentaethyl methylamino-tantalum (PEMAT), pentadiethylamino-tantalum (PDEAT), pentadimethylamino-tantalum (PDMAT), t-butylimino tris(diethylamino)tantalum (TBTDET), t-butylimino tris(dimethylamino)tantalum (TBTDMT), bis(cyclopentadienyl)tantalum trihydride, bis(methylcyclopentadienyl)tantalum trihydride, tantalum fluoride, tantalum bromide, tantalum chloride, derivatives thereof, and combinations thereof.

10. The method of claim 7, wherein the metal-containing precursor is selected from the group consisting of tetrakis (dimethylamino)titanium (TDMAT), tetrakis(ethylmethylamino)titanium (TEMAT), tetrakis(diethylamino)titanium (TDEAT), titanium tetrachloride ($TiCl_4$), titanium iodide ($TiI_4$), titanium bromide ($TiBr_4$), and derivatives thereof.

11. The method of claim 7, wherein the atomic layer deposition further comprises:
   alternately pulsing a metal-containing precursor, a silicon-containing precursor, and a nitrogen-containing precursor until a refractory metal silicon nitride layer having a thickness less than about 20 angstroms is deposited over at least a portion of a substrate surface, wherein the silicon-containing precursor is selected from the group consisting of silane, disilane, methylsilane, dimethylsilane, chlorosilane ($SiH_3Cl$), dichlorosilane ($SiH_2Cl_2$), trichlorosilane ($SiHCl_3$), and combinations thereof.

12. The method of claim 1, wherein the seed layer is a copper-containing seed layer.

13. The method of claim 1, wherein the seed layer has a thickness ranging from about 1,000 Å to about 2,000 Å.

14. The method of claim 1, wherein the barrier layer and the seed layer exhibit the same crystalline growth pattern.

15. The method of claim 1, wherein the barrier layer has a thickness ranging from about 10 Å to about 20 Å.

16. The method of claim 1, wherein the expanding channel has an inner diameter that gradually increases from an upper portion to a lower portion adjacent the tapered bottom surface.

17. The method of claim 1, wherein the one or more gas conduits comprises two gas conduits being connected to the sidewall of the expanding channel.

18. The method of claim 17, wherein the two gas conduits are positioned parallel to each other.

19. The method of claim 17, wherein each of the two gas conduits has an opening and is positioned about 180 degrees apart from one another.

20. The method of claim 19, wherein the opening of the two gas conduits is located at the same elevation.

* * * * *